(12) United States Patent
Chang et al.

(10) Patent No.: US 12,557,408 B2
(45) Date of Patent: Feb. 17, 2026

(54) PHOTOSENSOR HAVING GATE-ALL-AROUND STRUCTURE AND METHOD FOR FORMING THE PHOTOSENSOR

(71) Applicant: TAIWAN SEMICONDUCTOR MANUFACTURING COMPANY, LTD., Hsinchu (TW)

(72) Inventors: P.C. Chang, Hsinchu (TW); Ping-Hao Lin, Hsinchu (TW); Kuo-Cheng Lee, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 427 days.

(21) Appl. No.: 17/185,070

(22) Filed: Feb. 25, 2021

(65) Prior Publication Data

US 2022/0271076 A1 Aug. 25, 2022

(51) Int. Cl.
*H10F 39/00* (2025.01)
*H10F 39/12* (2025.01)
*H10F 39/18* (2025.01)

(52) U.S. Cl.
CPC ..... *H10F 39/80373* (2025.01); *H10F 39/014* (2025.01); *H10F 39/182* (2025.01); *H10F 39/199* (2025.01); *H10F 39/80377* (2025.01); *H10F 39/8053* (2025.01); *H10F 39/8063* (2025.01); *H10F 39/807* (2025.01)

(58) Field of Classification Search
CPC ................................. H10F 39/80373
See application file for complete search history.

(56) References Cited

U.S. PATENT DOCUMENTS

| | | | | |
|---|---|---|---|---|
| 7,271,052 B1* | 9/2007 | Forbes | ............... | H01L 29/7841 438/242 |
| 8,372,713 B2* | 2/2013 | Masuoka | ........... | H01L 27/0207 257/329 |
| 8,773,562 B1* | 7/2014 | Fan | .......... | H10F 39/18 348/308 |
| 2005/0057671 A1* | 3/2005 | Cole | ..................... | H10F 39/024 348/E9.01 |
| 2011/0180860 A1* | 7/2011 | Yamada | ............. | H01L 27/1461 257/E31.085 |
| 2015/0029374 A1* | 1/2015 | Kitano | ................... | H04N 25/75 257/292 |
| 2019/0305085 A1* | 10/2019 | Sung | ...................... | B82Y 10/00 |

* cited by examiner

*Primary Examiner* — Ali Naraghi
(74) *Attorney, Agent, or Firm* — Birch, Stewart, Kolasch & Birch, LLP

(57) ABSTRACT

A photosensor includes a substrate, a photo-detecting column, a gate structure, a floating node structure and a channel structure. The substrate has a first doping type. The photo-detecting column has a second doping type and is disposed in the substrate. The gate structure is disposed on the substrate in a vertical direction, and is electrically insulated from the photo-detecting column. The floating node structure is disposed on the gate structure opposite to the photo-detecting column in the vertical direction, and is electrically insulated from the gate structure. The channel structure extends through the gate structure, is electrically insulated from the gate structure, and is electrically connected to the photo-detecting column and the floating node structure.

20 Claims, 32 Drawing Sheets

PHOTOSENSOR HAVING GATE-ALL-AROUND STRUCTURE AND METHOD FOR FORMING THE PHOTOSENSOR

BACKGROUND

Photosensors, which convert incoming photons into digital signals to realize photosensing, have been widely adopted in various fields of application. There are different structures of photosensors being proposed for miniaturization or enhancing operation efficiency. For example, backside illuminated (BSI) structures have been proposed for improving the amount of photons received by photosensors. Multiple photodiodes in a photosensor may share the same transfer gate to achieve reduction of device dimension. New structures are still being researched for further improving the photosensing performance and dimension reduction.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
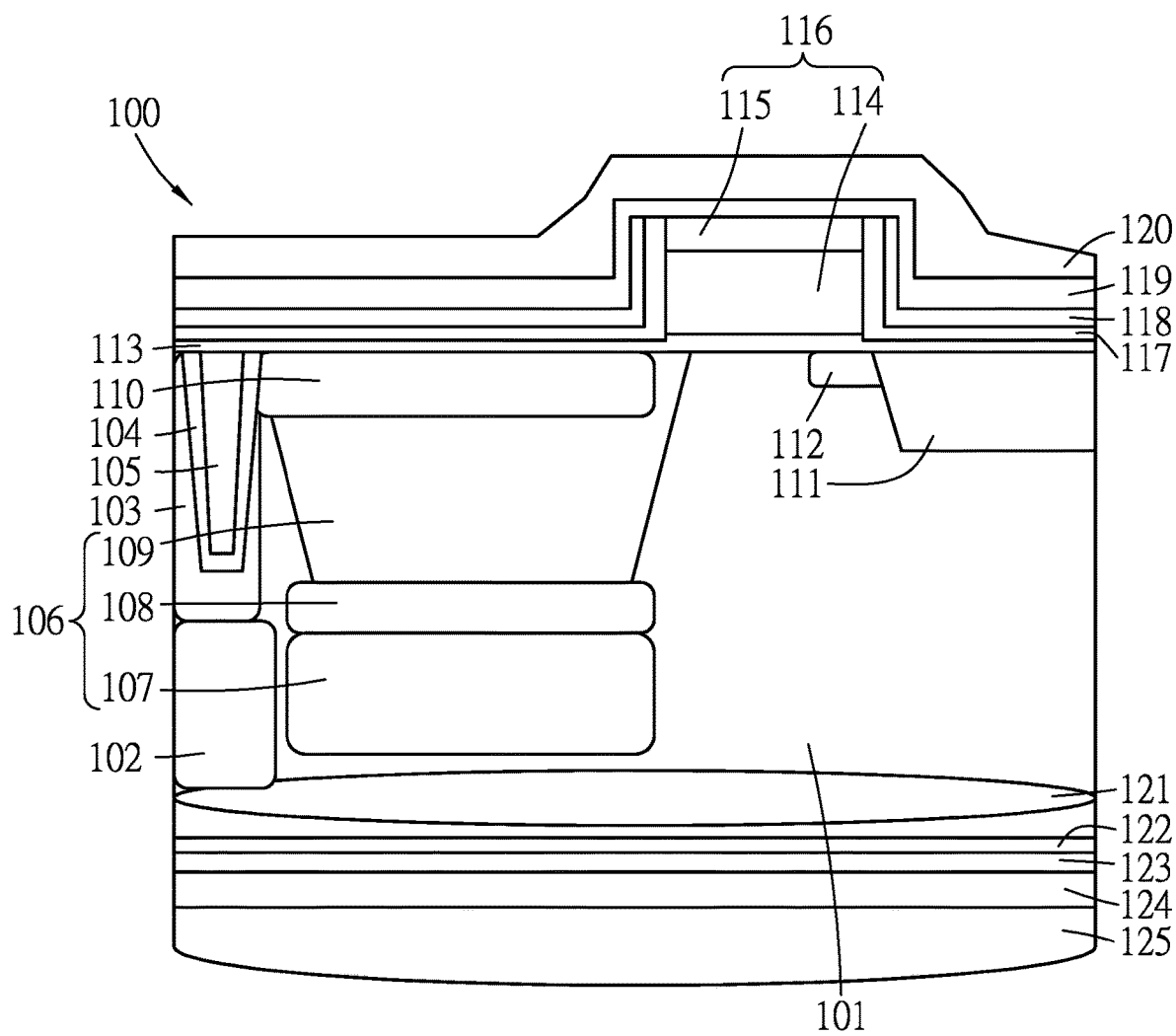
FIG. 1 is a schematic sectional view of a photosensor in accordance with some embodiments.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a schematic sectional view of a photosensor 100 in accordance with some embodiments. The photosensor 100 includes a substrate 101, which may be a p-type doped semiconductor. The substrate 101 includes an n-type region 106 that is formed in the substrate 101. In some embodiments, the substrate 101 may further include a p-type region 110, which may be referred to as a p-type pinned photodiode (PPPD) region. In some embodiments, the n-type region 106 includes two deep n-type pinned photodiode regions (DNPPD1, DNPPD2) 107, 108 and an n-type pinned photodiode (NPPD) region 109. In some embodiments, the n-type region 106 and the p-type region 110 may be surrounded by a deep p-well (DPW) 102 and a cell p-well (CPW) 103. In some embodiments, a field light doping region (FLD) 104 and a shallow trench isolation (STI) 105 may be formed in the cell p-well 103. In some embodiments, an n-type doped region 111 may be formed in the substrate 101, and may be referred to as a floating node (FD) or a floating diffusion region (FDR). In some embodiments, a pixel n-type lightly doped drain (PNLD) 112 may be formed in the substrate 101 and extend from the n-type doped region 111. In some embodiments, a gate dielectric layer 113 is formed over the substrate 101, and a gate structure 116 is formed over the gate dielectric layer 113. In some embodiments, the gate structure 116 may include a gate electrode 114 and an n-type region 115. The gate electrode 114 may be made of a suitable material, such as polysilicon or the like. A portion of the gate electrode 114 may be doped to form the n-type region 115. A dielectric layer 117 is conformally disposed on the gate dielectric layer 113 and the gate structure 116, and may be made from a suitable material, such as tetraethyl orthosilicate (TEOS) or the like. A resist protect oxide (RPO) layer 118 is conformally disposed on the dielectric layer 117, and may be made of a suitable material, such as silicon oxide or the like. A contact etch stop layer (CESL) 119 is conformally disposed on the resist protect oxide layer 118, and may be made of a suitable material, such as silicon nitride or the like. An inter-layer dielectric layer (ILD) 120 is disposed over the contact etch stop layer 119, and may be made of a suitable material, such as borophosphosilicate glass (BPSG), silicon oxide, fluorine-doped silicon oxide (FSG), carbon-doped silicon oxide, or the like. In some embodiments, the photosensor 100 may further include a deep doped region 121 and a backside doping region 122 formed in the substrate 101. In some embodiments, the photosensor 100 may further include an anti-reflective coating 123, a color filter film 124 and a microlens 125 connected to the backside of the substrate 101.

Figure 2:
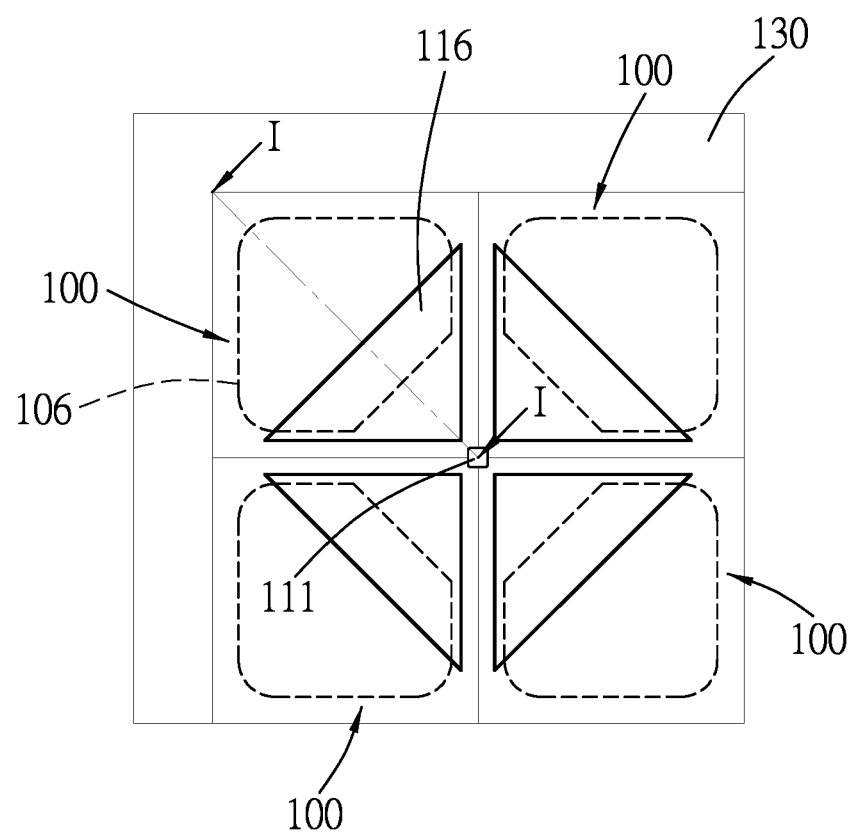
FIGS. 2 and 3 are schematic top views showing various arrangements of multiple photosensors in accordance with some embodiments.

FIG. 2 shows a top view of four photosensors 100 in accordance with some embodiments, in which the schematic sectional view of FIG. 1 is taken from line I-I of FIG. 2. As shown in FIG. 2, the four photosensors 100 share the same n-type doped region 111. Such configuration may be referred to as a four-share structure, which may be electrically connected to various devices, such as a source follower transistor, a reset transistor, a row select transistor, or the like, that are disposed in a region 130 adjacent to the photosensors 100.

Figure 3:
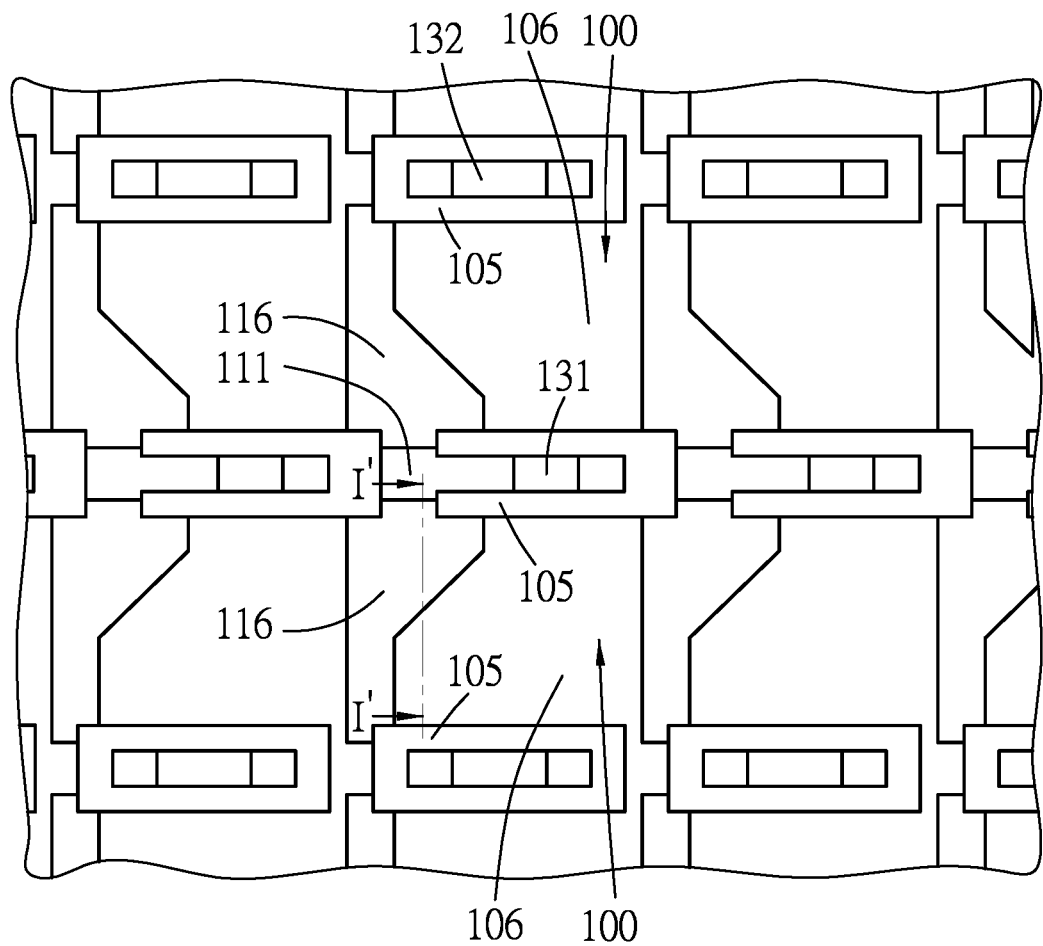

FIG. 3 is a top view showing that two photosensors 100 sharing the same n-type doped region 111, in which the schematic sectional view of FIG. 1 is taken from line I'-I' of FIG. 3. Such configuration may be referred to as a two-share structure, which may be electrically connected to a reset transistor 131 and/or a source follower transistor 132.

In accordance with some embodiments, the structure of a photosensor may be changed from those shown in FIGS. 1 to 3.

Figure 4:
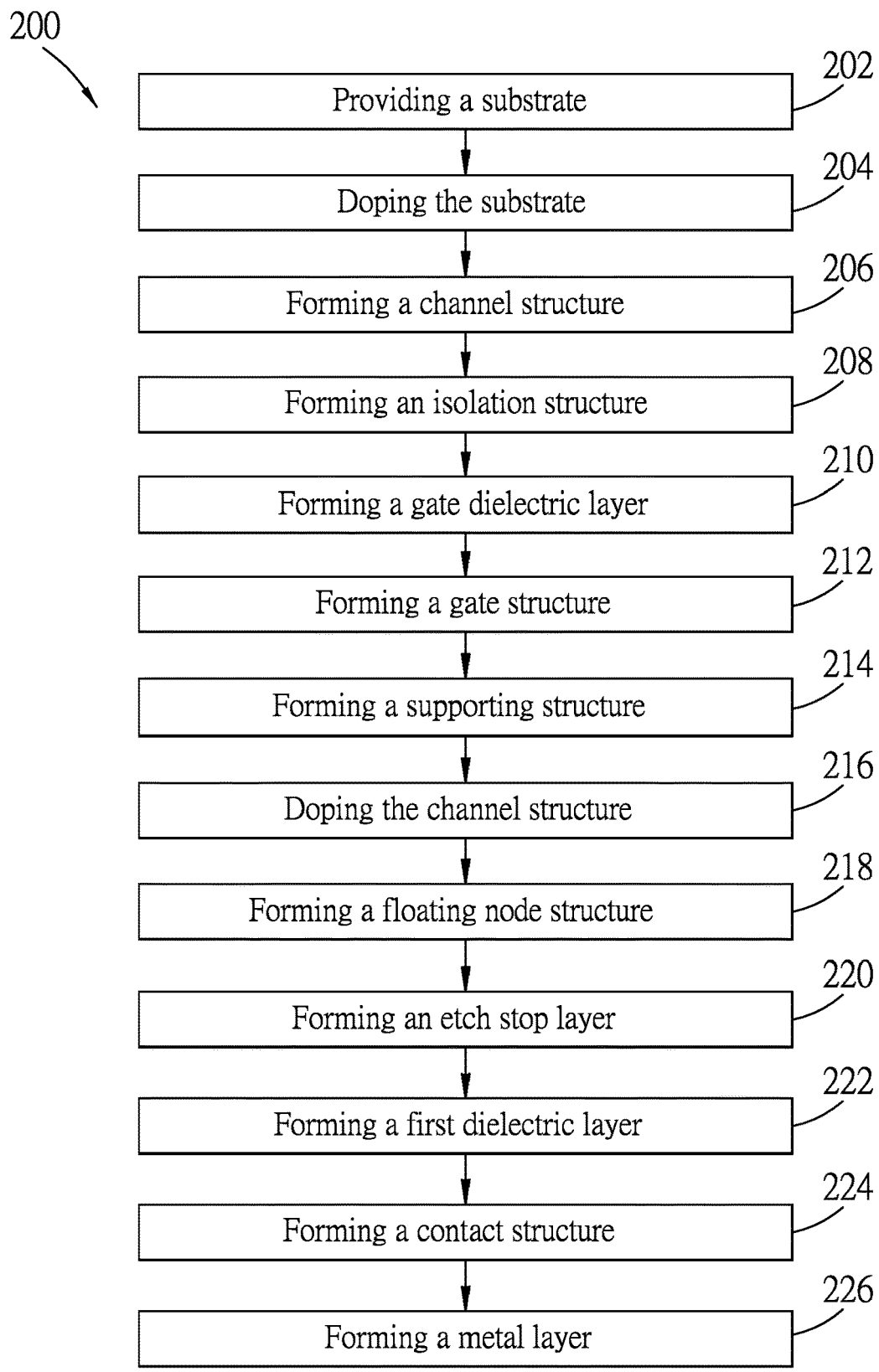
FIG. 4 is a process flow for making a photosensor in accordance with some embodiments.

FIG. 4 is a flow chart 200 showing a method of forming a photosensor 300 (see FIG. 16) in accordance with some embodiments. FIGS. 5 to 16 illustrate intermediate steps of forming the photosensor 300. In some embodiments, the photosensor 300 may be a CMOS image sensor (CIS), and in other embodiments, the photosensor 300 may be used for other photo-sensing applications.

Figure 5:
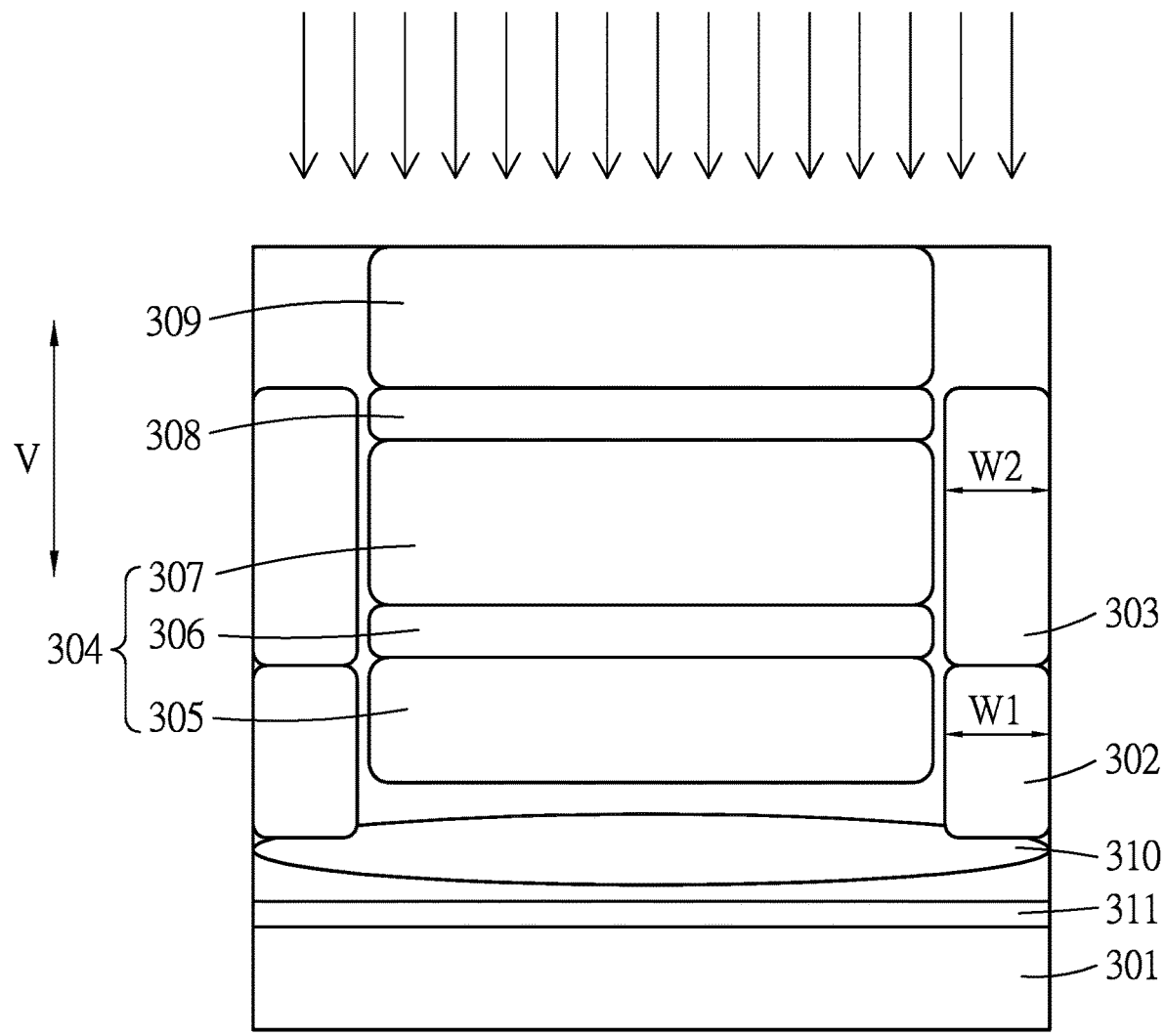
FIGS. 5 through 18 illustrate schematic views of stages in the formation of a photosensor in accordance with some embodiments.

FIG. 5 is a schematic sectional view showing a substrate 301. The provision of the substrate 301 is illustrated as process 202 in the flow chart 200 shown in FIG. 4. In some embodiments, the substrate 301 may be a p-type doped silicon substrate, and may have a doping concentration ranging from about $10^{15}/cm^3$ to about $10^{18}/cm^3$, and other concentration values are also within the scope of the disclosure.

FIG. 5 also shows that the substrate 301 is doped by a suitable technique, such as ion implantation or the like. This process is illustrated as process 204 in the flow chart 200 shown in FIG. 4. In accordance with some embodiments, the substrate 301 is doped to form a backside doping region 311. In some embodiments, the backside doping region 311 may be p-type doped with a suitable dopant (e.g., boron or the like), may be referred to as a backside P+(BS P+) region, and may have a doping concentration ranging from about $10^{16}/cm^3$ to about $10^{20}/cm^3$, and other concentration values are also within the scope of the disclosure. The substrate 301 may be further doped to form a deep doped region 310 with a suitable dopant, such as arsenic, phosphorus, or the like. The deep doped region 310 may be referred to as an array deep n-well (ADNW), and may have a doping concentration ranging from about $10^{16}/cm^3$ to about $10^{19}/cm^3$, and other concentration values are also within the scope of the disclosure. The substrate 301 is further doped to form an n-type doped region 304 (which may be referred to as a photodiode (PD) region) with a suitable dopant, such as arsenic, phosphorus, or the like. In some embodiments, the n-type doped region 304 may have a plurality of sub-regions formed by doping the substrate 301 multiple times. In some embodiments, the n-type doped region 304 has first, second and third doped sub-regions 305, 306, 307, which may respectively be referred to as a first deep n-type pinned photodiode (DNPPD1) region, a second deep n-type pinned photodiode (DNPPD2) region, and an n-type pinned photodiode (NPPD) region. In some embodiments, each of the first, second and third doped sub-regions 305, 306, 307 may have a doping concentration ranging from about $10^{15}/cm^3$ to about $10^{18}/cm^3$, and other concentration values are also within the scope of the disclosure. In some embodiments, the first, second and third doped sub-regions 305, 306, 307 may have the same or different horizontal widths and may have the same or different vertical thicknesses, and the n-type doped region 304 may have less than or more than three sub-regions. In some embodiments, the substrate 301 may be further doped to form a p-type doped region 308 with a suitable dopant, such as boron or the like. In some embodiments, the p-type doped region 308 may be located above the n-type doped region 304. The p-type doped region 308 may be referred to as a p-type pinned photodiode (PPPD) region, and may have a doping concentration ranging from about $10^{15}/cm^3$ to about $10^{18}/cm^3$, and other concentration values are also within the scope of the disclosure. In some embodiments, the substrate 301 may be further doped, with a suitable dopant (e.g., boron or the like), to form a channel doped region 309, which may be p-type doped and may have a doping concentration ranging from about $10^{15}/cm^3$ to about $10^{18}/cm^3$, and other concentration values are also within the scope of the disclosure. In some embodiments, the substrate 301 may not be formed with the p-type doped region 308, and the n-type doped region 304 may be spaced apart from the channel doped region 309 or may be adjacent to the channel doped region 309. In some embodiments, the substrate 301 is further doped, with a suitable dopant (e.g., boron or the like), to form a deep p-well (DPW) 302, which may have a doping concentration ranging from about $10^{15}/cm^3$ to about $10^{18}/cm^3$, and other concentration values are also within the scope of the disclosure. In some embodiments, the deep p-well 302 may overlap the deep doped region 310. In some embodiments, the substrate 301 is further doped, with a suitable dopant (e.g., boron or the like), to form a cell p-well (CPW) 303, which may have a doping concentration ranging from about $10^{15}/cm^3$ to about $10^{18}/cm^3$, and other concentration values are also within the scope of the disclosure. The deep p-well 302 and the cell p-well 303 surround the n-type doped region 304 and the p-type doped region 308, and may be aligned along a vertical direction (V). In some embodiments, a horizontal width (W1) of the deep p-well 302 and a horizontal width (W2) of the cell p-well 303 may be the same; in other embodiments, the horizontal width (W1) of the deep p-well 302 and the horizontal width (W2) of the cell p-well 303 may be different. In some embodiments, each of the first, second and third doped sub-regions 305, 306, 307 of the n-type doped region 304, and the p-type doped region 308 may be spaced apart from the deep p-well 302 and/or the cell p-well 303. In other embodiments, at least one of the p-type doped region 308, the first doped sub-region 305, the second doped sub-region 306 and the third doped sub-region 307 may overlap the deep p-well 302 and/or the cell p-well 303. In some embodiments, the deep p-well 302 and the cell p-well 303 may be formed before the formation of the n-type doped region 304, the p-type doped region 308 and the channel doped region 309.

Figure 6:
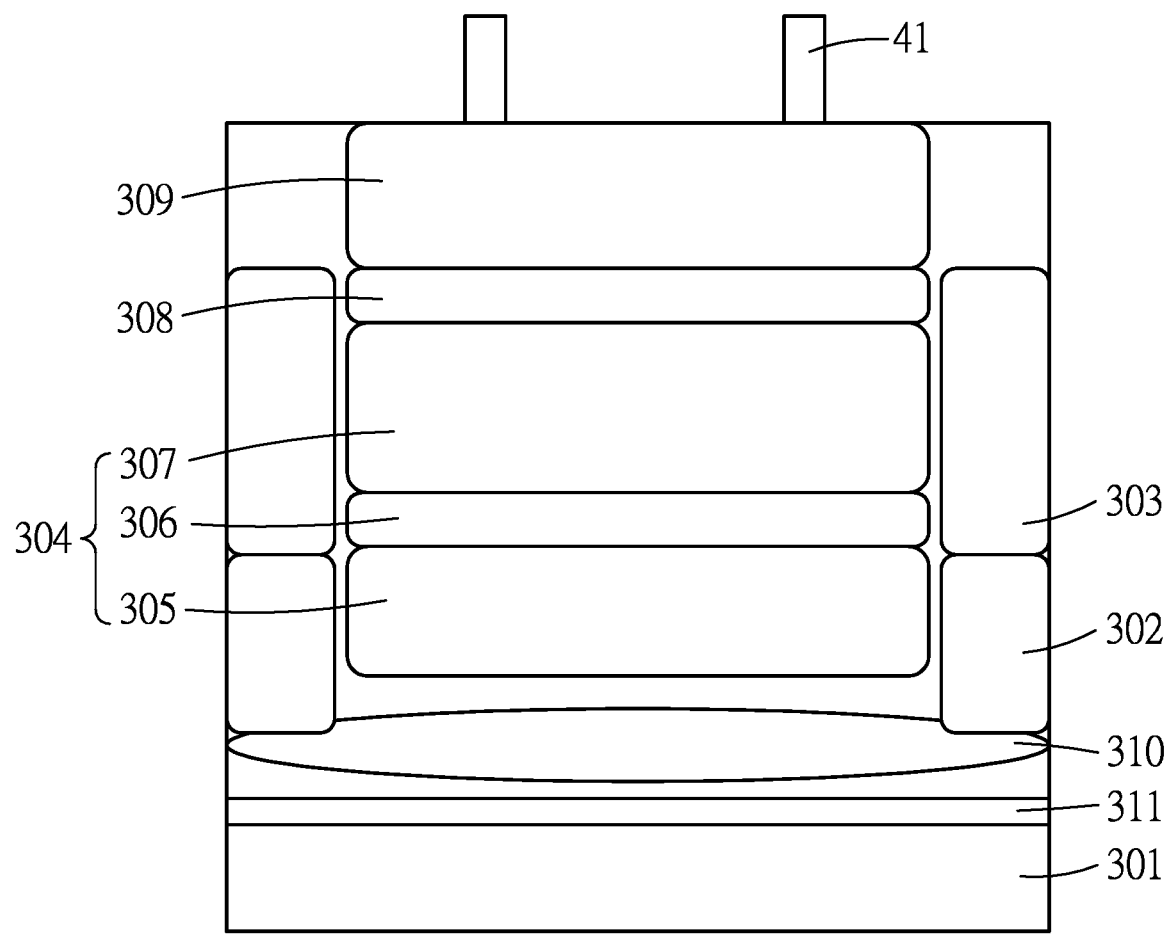

Referring to FIG. 6, a mask layer 41 may be formed on the substrate 301, and is defined to have a desirable pattern. In some embodiments, the mask layer 41 may be a photoresist layer made of a suitable photosensitive material. In other embodiments, the mask layer 41 may be a hardmask made of a suitable material, such as metal oxide, metal nitride, or the like, and may be formed by a suitable technique, such as physical vapor deposition (PVD), chemical vapor deposition (CVD), atomic layer deposition (ALD), or the like.

Figure 7:
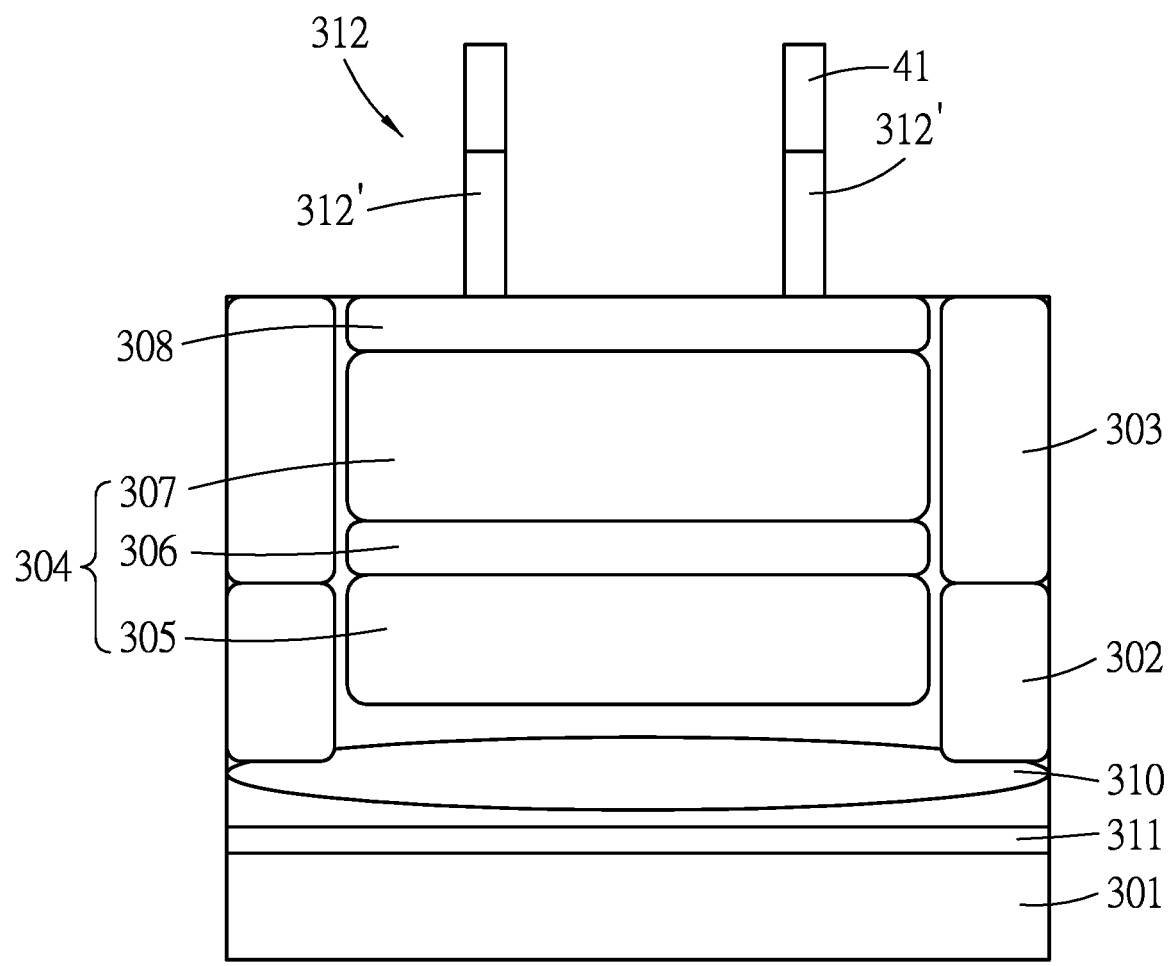
Figure 19:
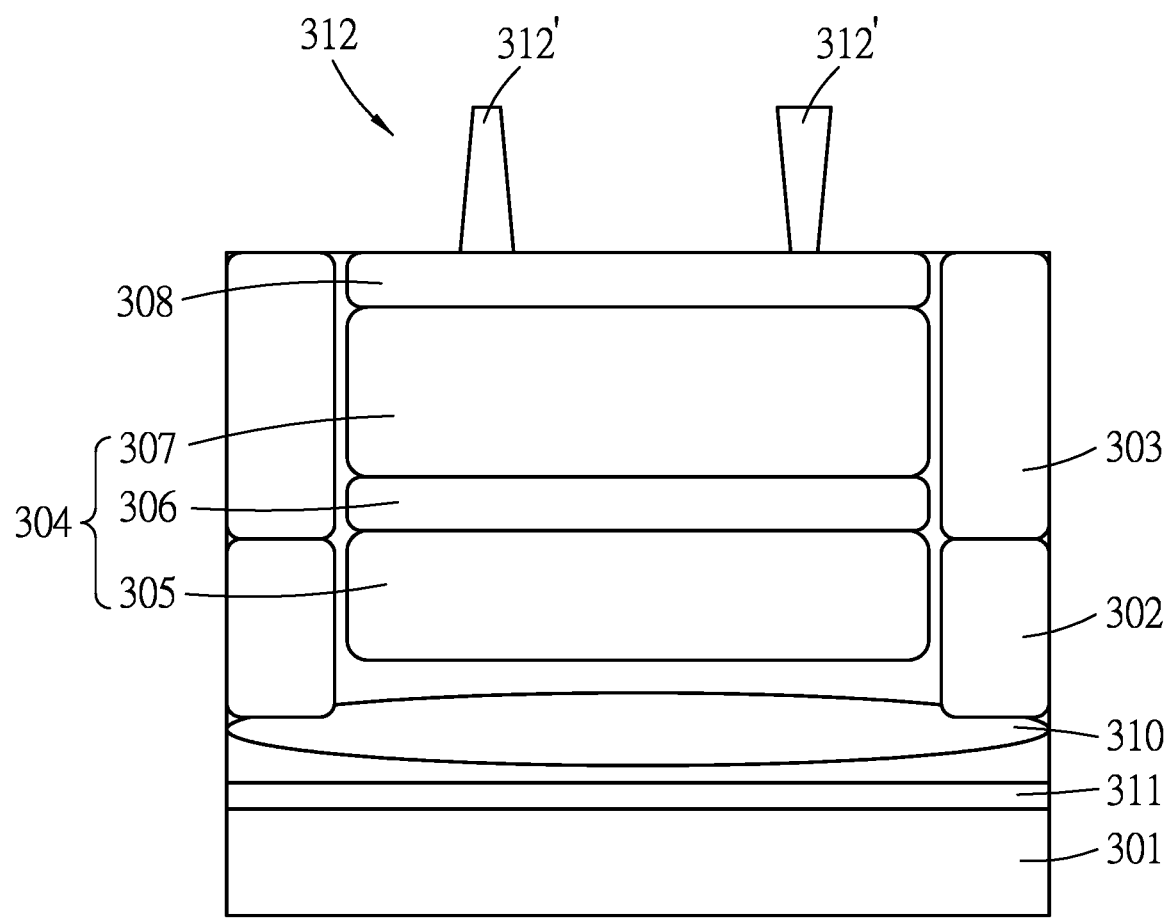
FIG. 19 is a schematic view showing channel regions of a photosensor in accordance with some embodiments having different structures.
Figure 20:
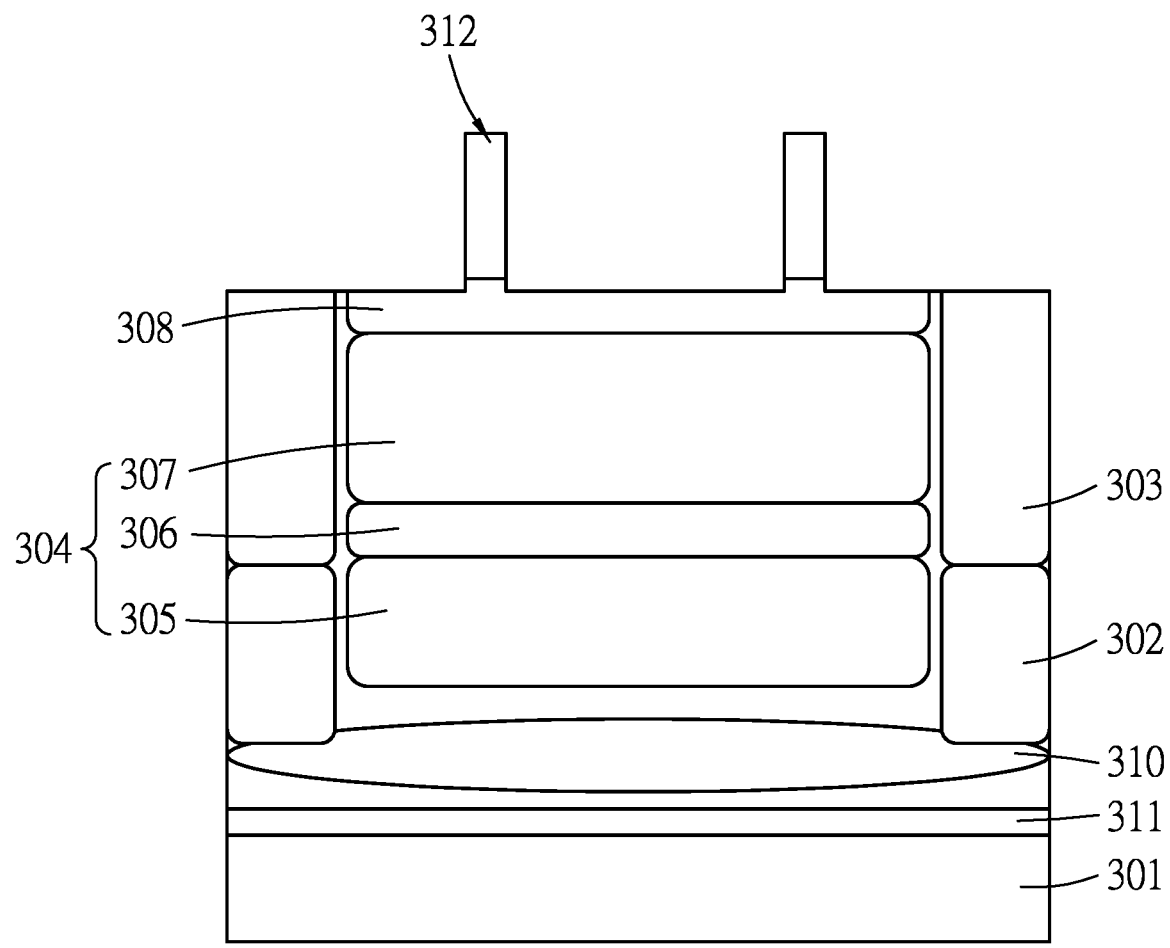
FIG. 20 is a schematic view showing an over-etch of a substrate in making a photosensor in accordance with some embodiments.

Referring to FIG. 7, after the formation of the mask layer 41, a top portion of the substrate 301 is etched, using the mask layer 41 as an etch mask, to form a channel structure 312. When the channel doped region 309 (see FIG. 6) is formed, the channel structure 312 is a portion of the channel doped region 309. In some embodiments, the channel structure 312 may be undoped under the situation that the channel doped region 309 is not formed, or may be n-type doped. In some embodiments, the channel structure 312 may include one or more channel region(s) 312'. In some embodiments, each of the channel regions 312' of the channel structure 312 may be a cylinder, which has a rectangular cross section as shown in FIG. 7. In other embodiments, each of the channel regions 312' of the channel structure 312 may be in a shape of a frustum, which has a trapezoid cross section as shown in FIG. 19, and other shapes are also within the scope of the disclosure. In some embodiments, the etching process may be conducted using a suitable etching technique, such as a fluorine reactive ion etching (RIE), or the like. Referring to FIG. 20, in some embodiments, the etching process may slightly over-etch into the p-type doped region 308 and the cell p-well 303.

Figure 8:
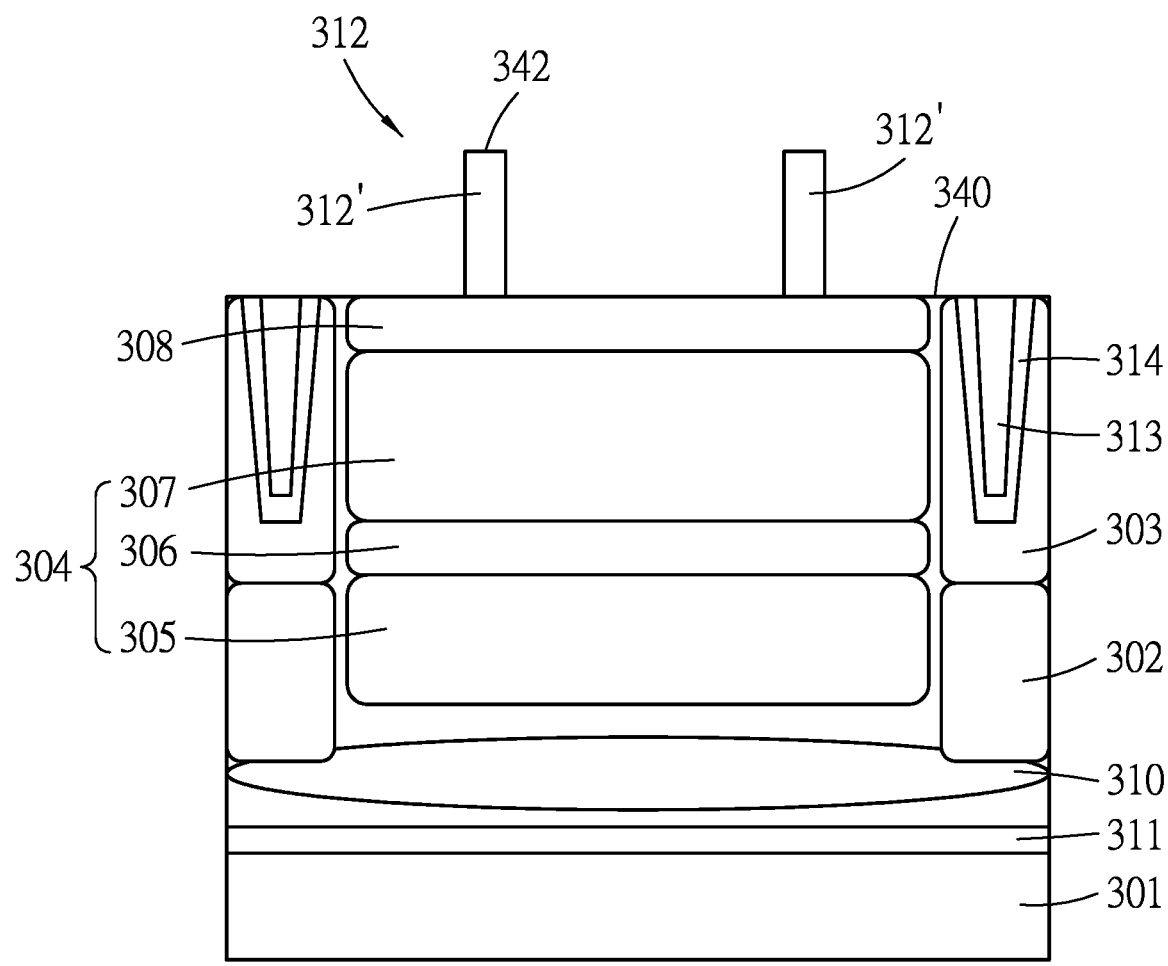

Referring to FIG. 8, after the etching process, the mask layer 41 (see FIG. 7) is removed. The processes illustrated in FIGS. 6 to 8 may be collectively referred to as a process of forming the channel structure, which is illustrated as process 206 in the flow chart 200 shown in FIG. 4. Afterwards, an isolation structure 313 is formed in the cell p-well 303. This process is illustrated as process 208 in the flow chart 200 shown in FIG. 4. In some embodiments, the isolation structure 313 may be made of a suitable material, such as silicon oxide, silicon nitride, silicon carbide or the like, and may be located within the cell p-well 303 or may slightly extend outside of the cell p-well 303. In some embodiments, a field light doping region (FLD) 314 may be formed in the cell p-well 303, and may have a doping concentration ranging from about $10^{17}/cm^3$ to about $10^{21}/cm^3$, and other concentration values are also within the scope of the disclosure. In some embodiments, the isolation structure 313 may be located within the field light doping region 314. In other embodiments, the isolation structure 313 may be partially located outside of the field light doping region 314.

Figure 9:
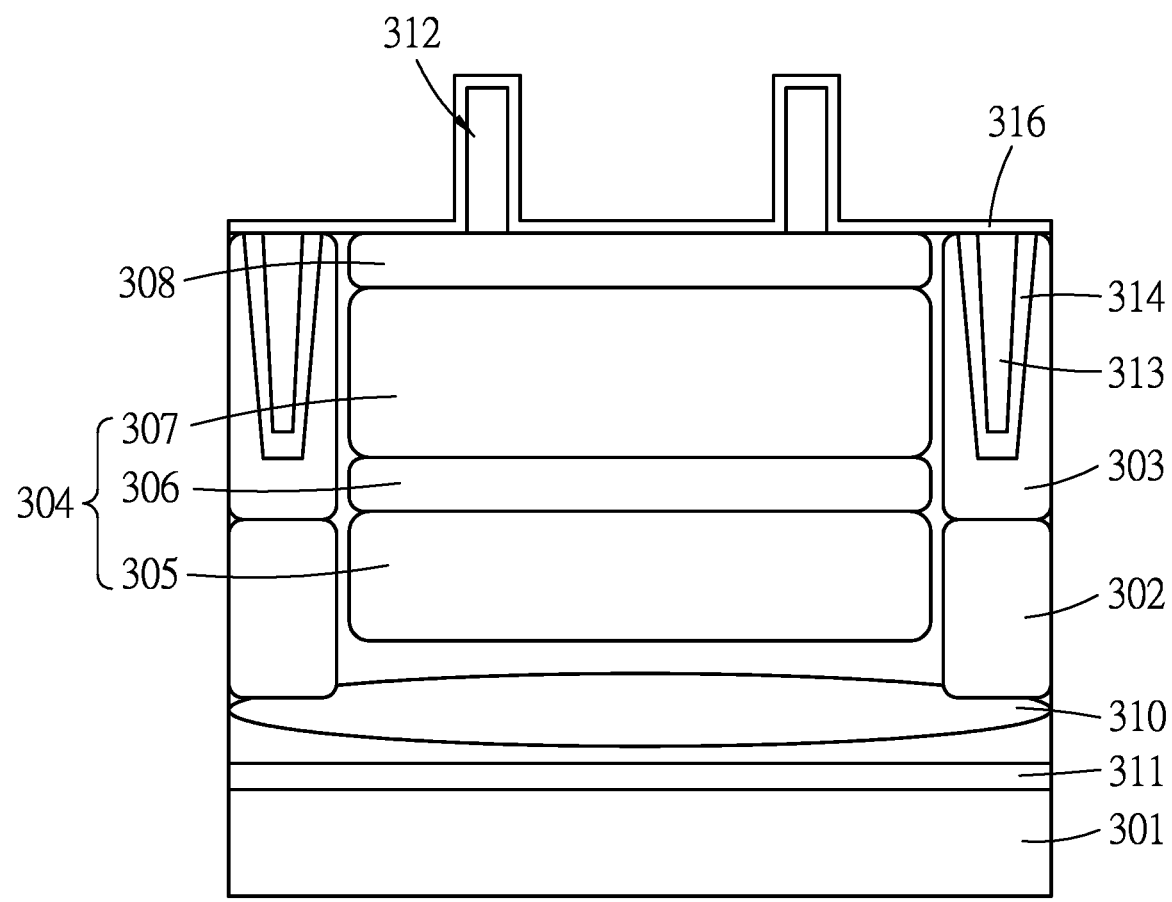

Referring to FIG. 9, after the formation of the isolation structure 313, a gate dielectric layer 316 is conformally formed on the substrate 301 by a suitable technique, such as CVD, PVD, ALD, or the like. This process is illustrated as process 210 in the flow chart 200 shown in FIG. 4. In some embodiments, the gate dielectric layer 316 covers a top surface 340 of the substrate 301 (see FIG. 8) and encapsulates the channel structure 312. The gate dielectric layer 316 may be made of a suitable material, such as silicon oxide, a high-k dielectric material (e.g., hafnium oxide, hafnium silicon oxide, hafnium tantalum oxide, aluminum oxide, zirconium oxide, etc.), or the like. In some embodiments, the gate dielectric layer 316 may have a thickness ranging from about 1 nm to about 10 nm. In other embodiments, the gate dielectric layer 316 may have a thickness ranging from about 2 nm to about 6 nm, and other range values are also within the scope of the disclosure.

Figure 10:
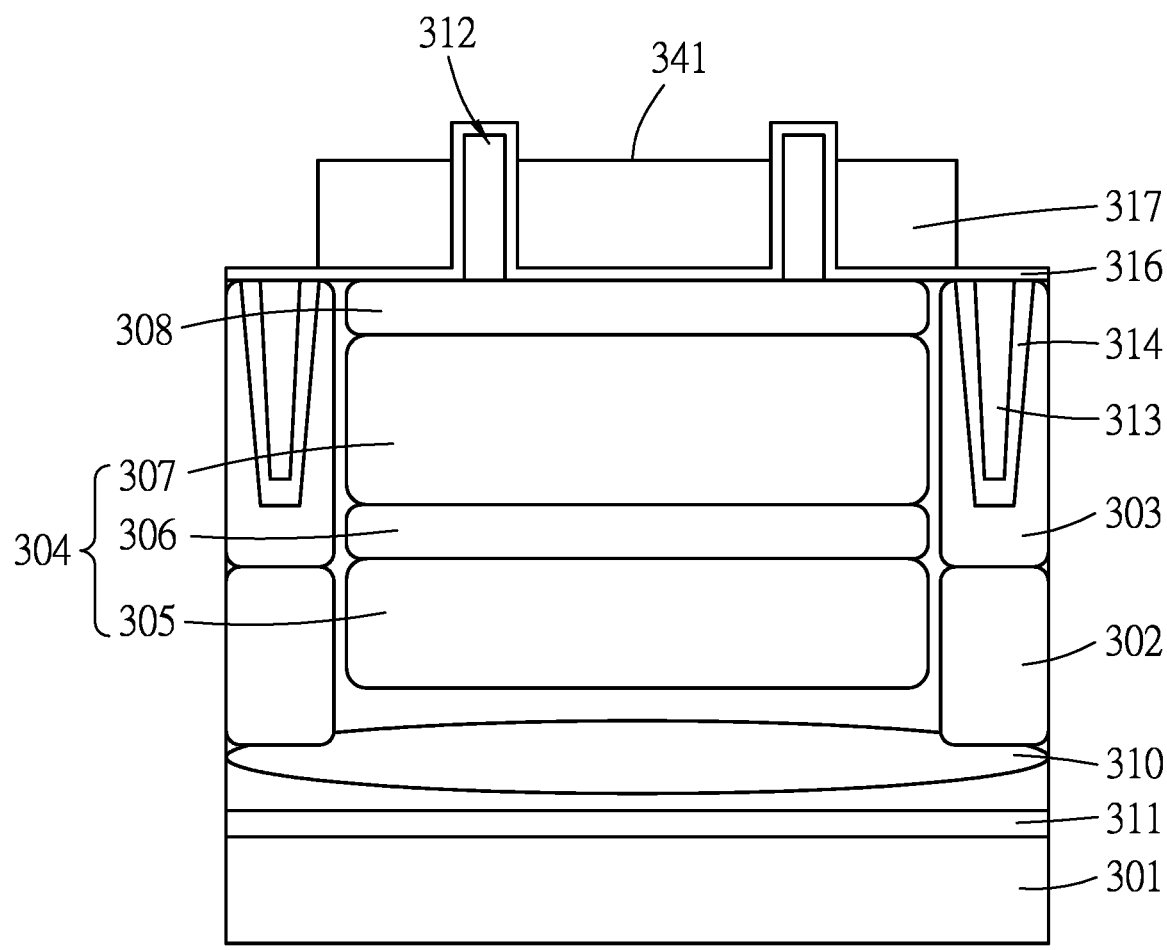
Figure 21:
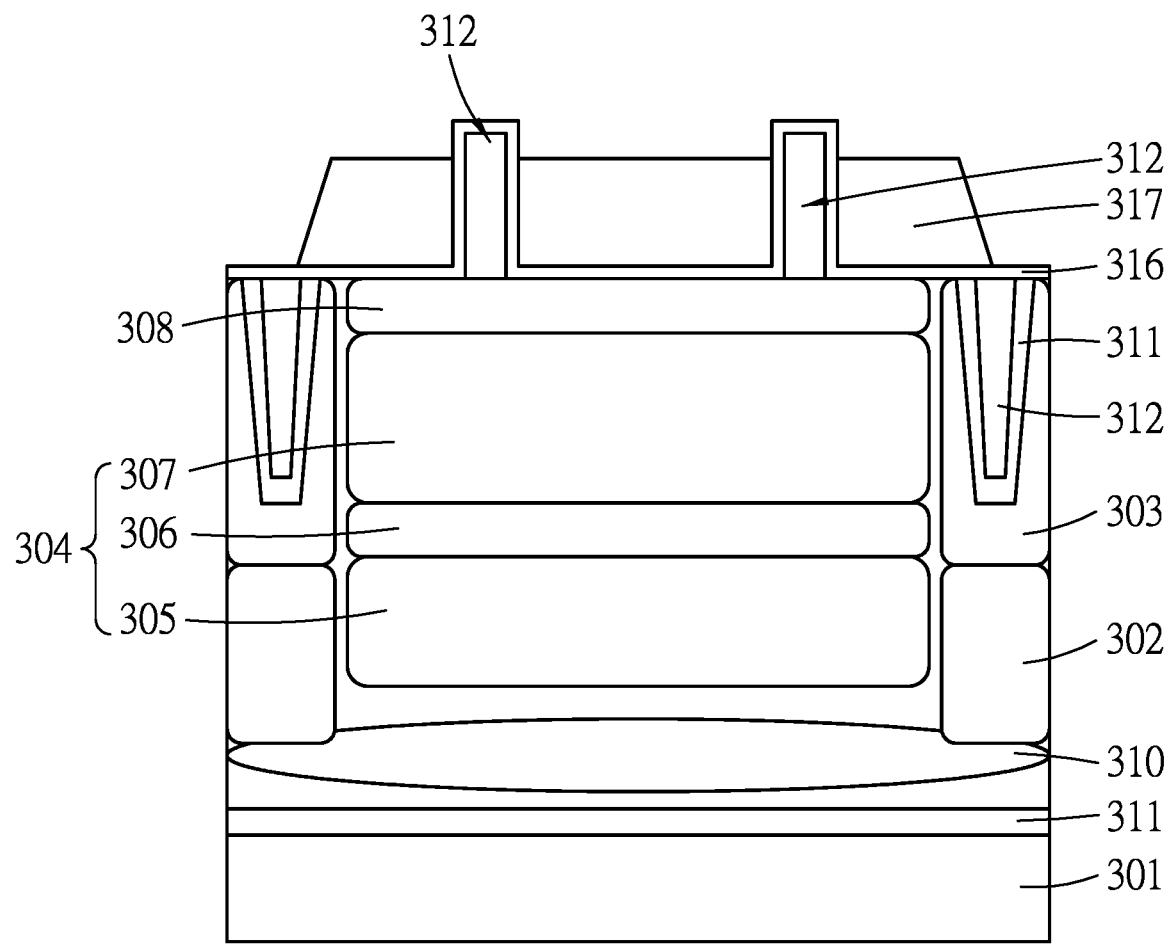
FIG. 21 is a schematic view showing a gate structure of a photosensor in accordance with some embodiments.

Referring to FIG. 10, after the formation of the gate dielectric layer 316, a gate structure 317 is formed over the substrate 301 by a suitable technique, such as CVD, PVD, ALD, or the like. This process is illustrated as process 212 in the flow chart 200 shown in FIG. 4. The gate structure 317 may be made of a suitable material, such as polysilicon, metal or a metal compound (e.g., TiN, TaN, W, Ti, Ta, Al or the like), or the like. In some embodiments, the gate structure 317 has a top surface 341 that is lower than a top surface 342 of the channel structure 312 (see FIG. 8), and the gate structure 317 surrounds a portion of the channel structure 312 and a portion of the gate dielectric layer 316 formed on the channel structure 312. In some embodiments, the gate structure 317 may be formed in a controlled deposition process to have a desirable shape. In other embodiments, the gate structure 317 may be made by covering the gate dielectric layer 316 with polysilicon or a metal compound, followed by removing a portion of the polysilicon or the metal compound by a suitable etching technique, such as dry etching or the like, to form the desirable shape. Referring to FIG. 21, in some embodiments, the gate structure 317 may have a wider bottom portion and a narrower upper portion, which may be caused by dry etch or the like, and other geometries are also within the scope of the disclosure.

Figure 11:
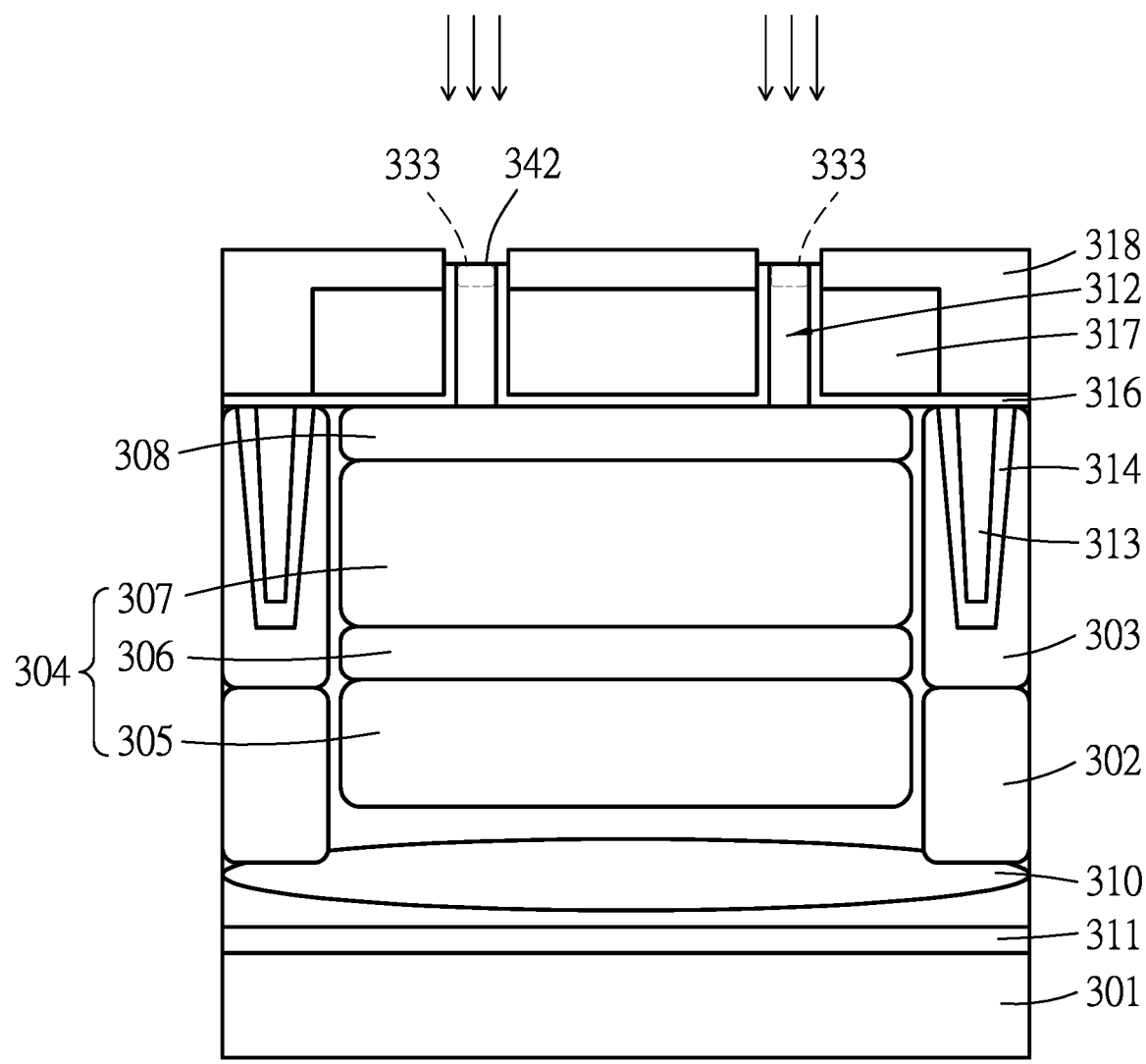

Referring to FIG. 11, after the formation of the gate structure 317, a supporting structure 318 is formed over the gate dielectric layer 316 and the gate structure 317. This process is illustrated as process 214 in the flow chart 200 shown in FIG. 4. The supporting structure 318 may be formed by a suitable technique, such as spin-on coating, CVD, ALD or the like. In some embodiments, a suitable planarization process, such as chemical mechanical planarization (CMP) or the like, may be applied to the deposited supporting structure 318 to reduce the thickness of the supporting structure 318 to a desirable amount. In some embodiments, the supporting structure 318 may be made of a suitable material, such as undoped silicate glass (USG), phosphosilicate glass (PSG), borosilicate glass (BSG), boron-doped phosphosilicate glass (BPSG), fluorine-doped silicate glass (FSG), silicon dioxide ($SiO_2$), SiOC-based materials, or the like. After the formation of the supporting structure 318, a portion of the supporting structure 318 and the gate dielectric layer 316 may be removed by a suitable technique, such as dry etch, to expose the top surface 342 of the channel structure 312. Afterwards, in some embodiments, a portion 333 of each of the channel regions 312' of the channel structure 312 not surrounded by the gate structure 317 may be doped with a suitable dopant (e.g., phosphorus, arsenic or the like), and may have a doping concentration ranging from about $10^{19}/cm^3$ to about $10^{21}/cm^3$, and other concentration values are also within the scope of the disclosure. This process is illustrated as process 216 in the flow chart 200 shown in FIG. 4.

Figure 12:
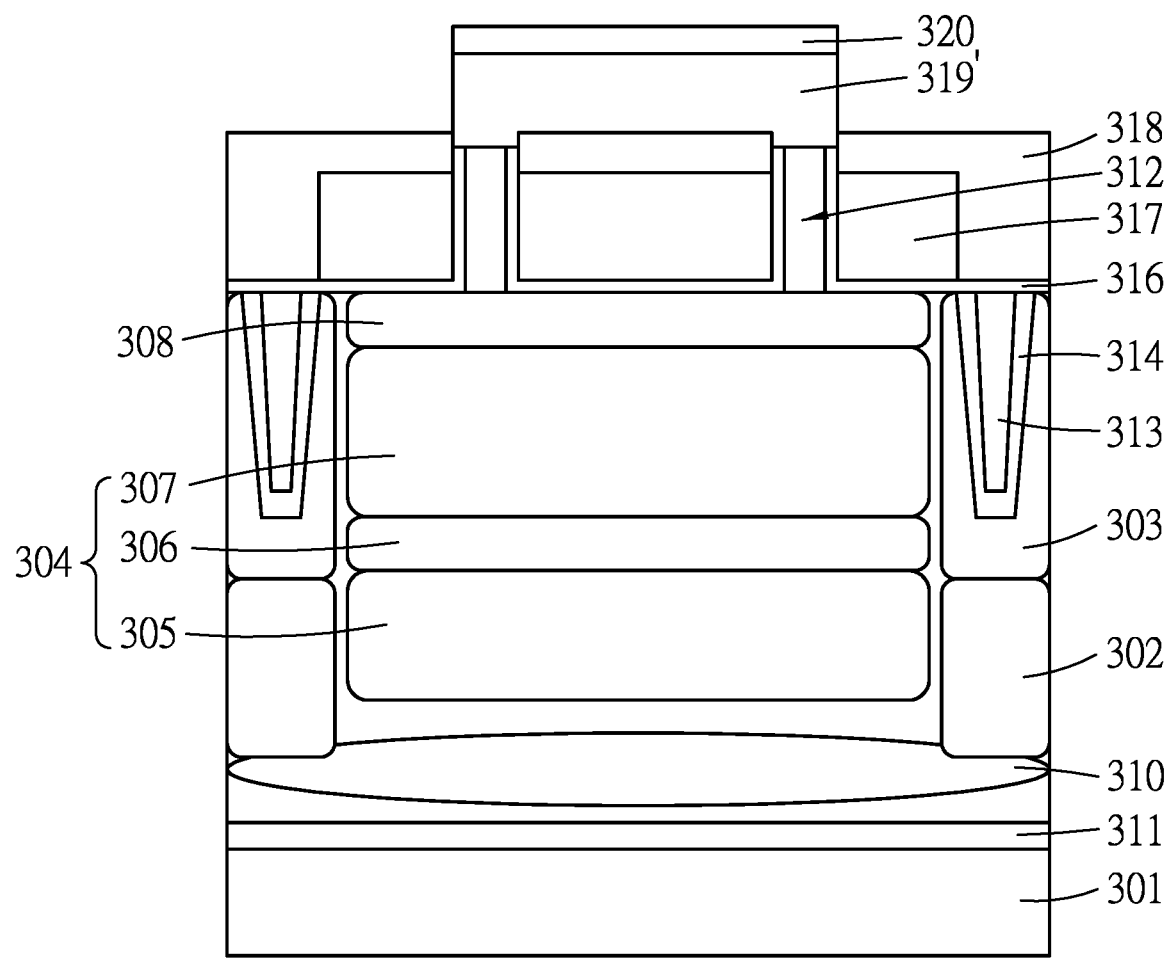
Figure 22:
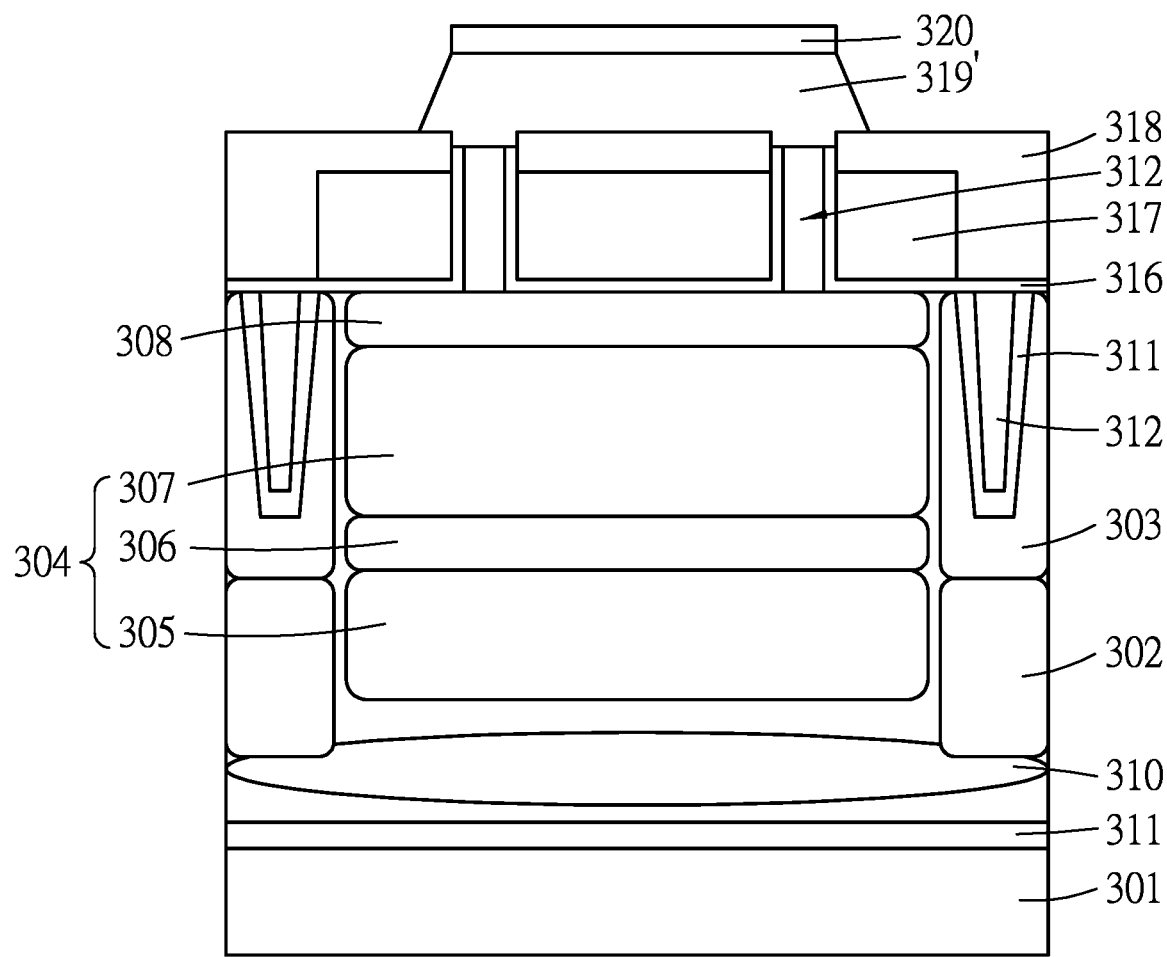
FIG. 22 is a schematic view showing a floating node structure of a photosensor in accordance with some embodiments.

Referring to FIG. 12, after the doping process, a floating node (FD) structure 319' (which may also be referred to as a floating diffusion region (FDR)) is formed over the supporting structure 318, is connected to the channel structure 312, and is separated from the gate structure 317 by the supporting structure 318. This process is illustrated as process 218 in the flow chart 200 shown in FIG. 4. The floating node structure 319' may be formed by a suitable technique, such as CVD, PVD, ALD or the like. The floating node structure 319' may be made of a suitable material, such as polysilicon, metal or a metal compound (e.g., TiN, TaN, W, Ti, Ta, Al or the like), or the like. In some embodiments, when the floating node structure 319' is made of polysilicon, the floating node structure 319' may be doped with a suitable dopant (e.g., arsenic, phosphorus, or the like), and may have a doping concentration ranging from about $10^{18}/cm^3$ to about $10^{21}/cm^3$, and other concentration values are also within the scope of the disclosure. In some embodiments, the gate structure 317 and the floating node structure 319' are made of the same material. In other embodiments, the gate structure 317 and the floating node structure 319' are made of different materials. In some embodiments, the floating node structure 319' may be formed by covering the supporting structure 318 with a suitable material, followed by etching the suitable material with an appropriate technique (e.g., dry etch or the like) to form the floating node structure 319' having a desirable shape. Referring to FIG. 22, in some embodiments, the floating node structure 319' may have a wider bottom portion and a narrower upper portion, which may be caused by dry etch or the like, and other geometries are also within the scope of the disclosure.

FIG. 12 also shows that, after the formation of the floating node structure 319', an etch stop layer (ESL) 320 may be formed on the floating node structure 319'. This process is illustrated as process 220 in the flow chart 200 shown in FIG. 4. The etch stop layer 320 may be formed by a suitable process, such as PVD, CVD, ALD or the like, may be made of a suitable material, such as silicon nitride (SiN), silicon carbide (SiC), silicon oxynitride (SiNO), silicon oxide (SiO$_2$) or the like, and may have a thickness ranging from about 10 nm to about 200 nm, and other range values are also within the scope of the disclosure.

Figure 13:
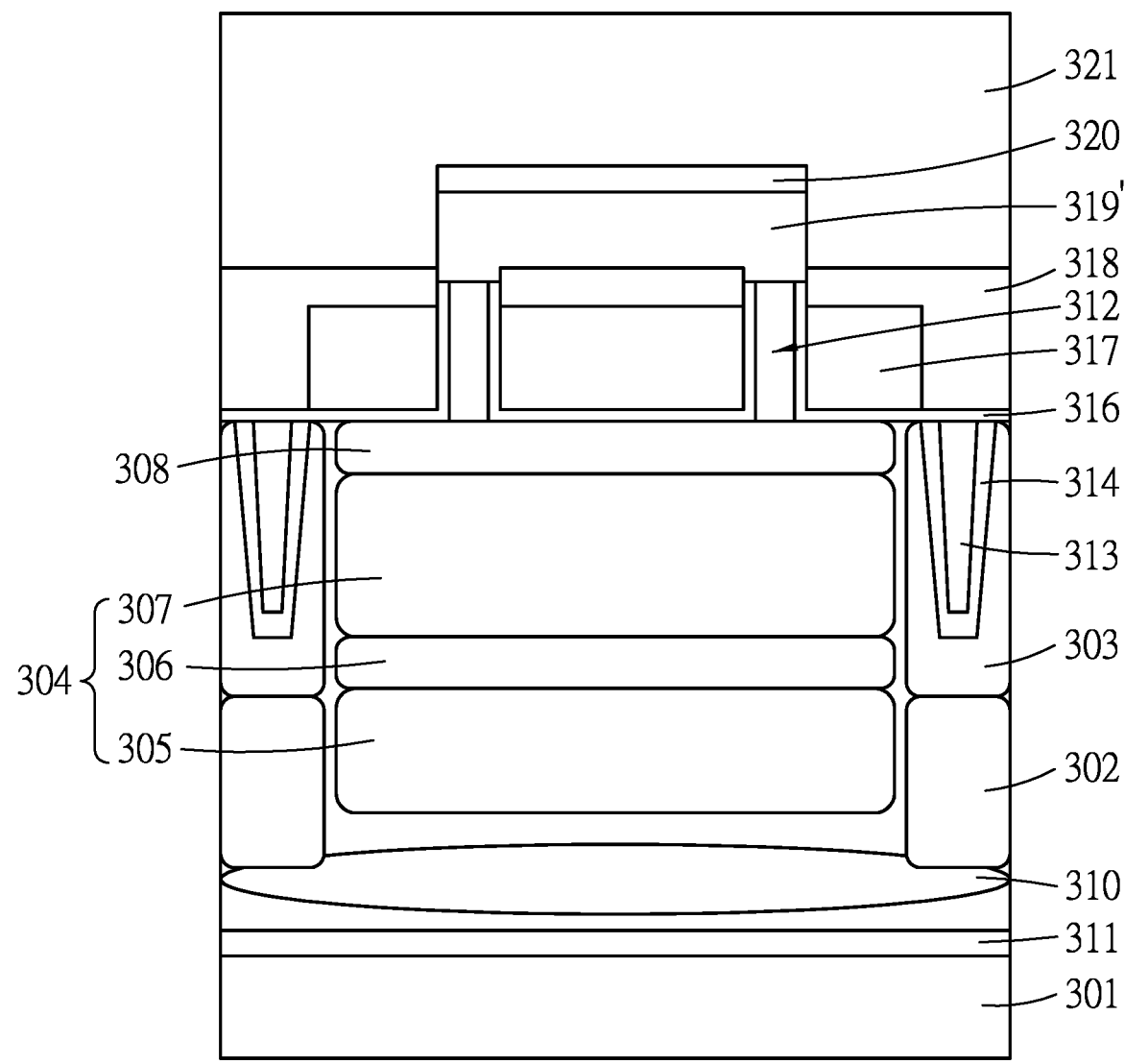

Referring to FIG. 13, after the formation of the etch stop layer 320, a first dielectric layer 321 is formed over the supporting structure 318, the floating node structure 319' and the etch stop layer 320. This process is illustrated as process 222 in the flow chart 200 shown in FIG. 4. The first dielectric layer 321 may be formed by a suitable technique, such as spin-on coating, CVD, ALD or the like, and may be made of a suitable material, such as undoped silicate glass, phosphosilicate glass, borosilicate glass, boron-doped phosphosilicate glass, fluorine-doped silicate glass, silicon dioxide, SiOC-based materials, or the like. In some embodiments, the supporting structure 318 and the first dielectric layer 321 are made of the same material. In other embodiments, the supporting structure 318 and the first dielectric layer 321 are made of different materials.

Figure 14:
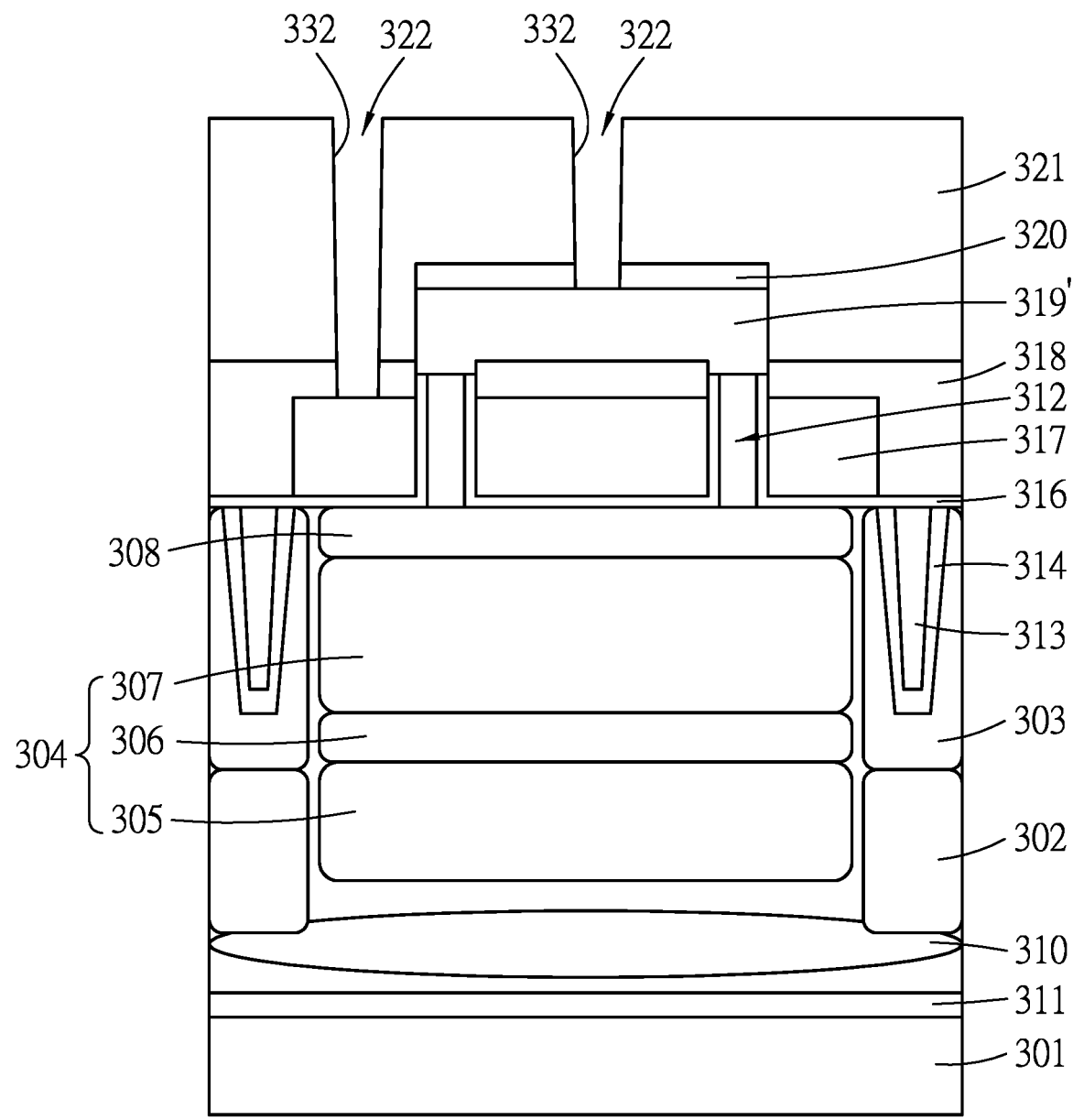

Referring to FIG. 14, after the formation of the first dielectric layer 321, a plurality of contact openings 322 are formed to penetrate the first dielectric layer 321, the etch stop layer 320 and the supporting structure 318 such that the floating node structure 319' and the gate structure 317 are exposed from the contact openings 322. Each of the contact openings 322 is defined by an opening wall 332 and is formed by a suitable technique, such as dry etch or the like.

Figure 15:
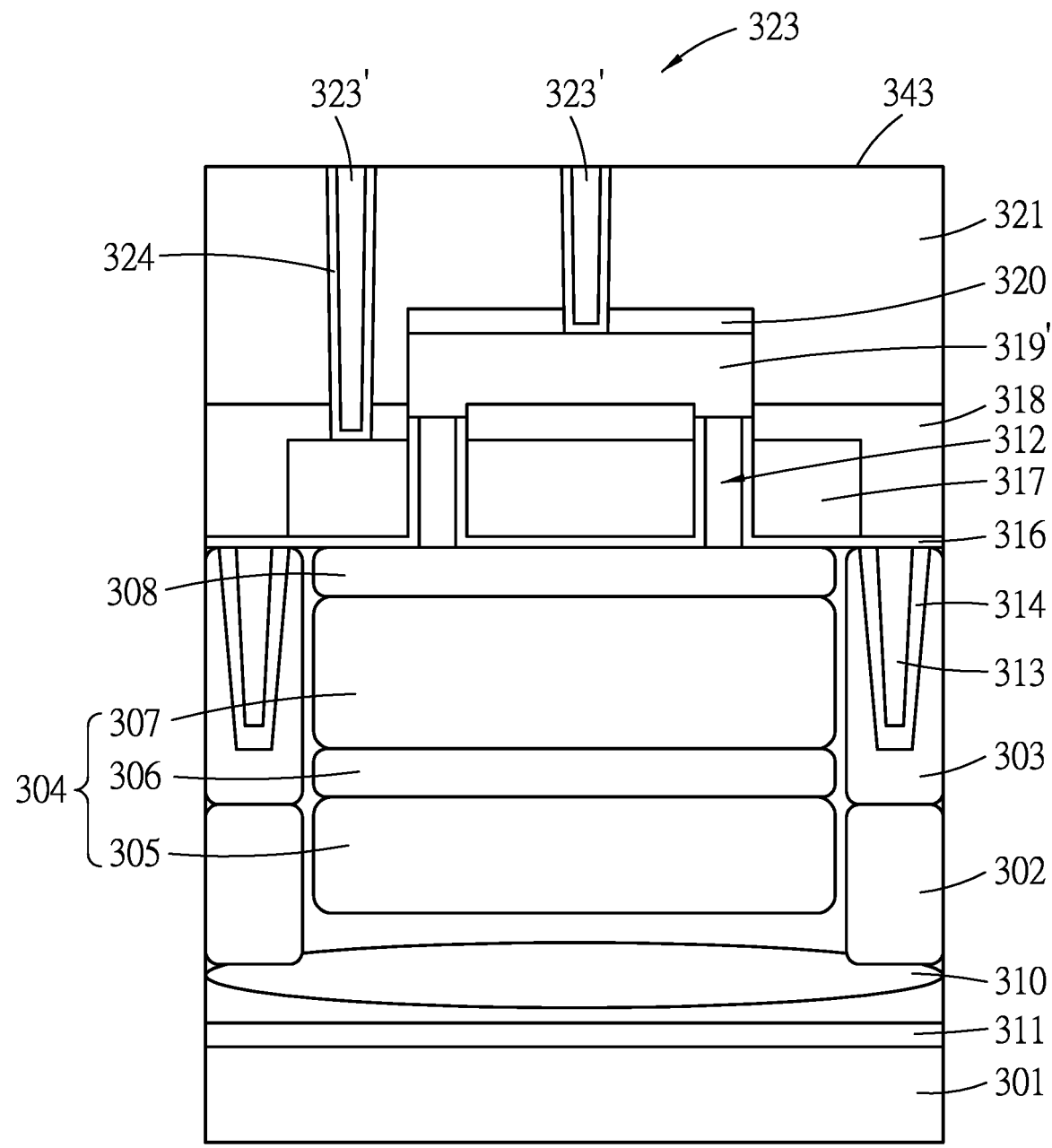

Referring to FIG. 15, after the formation of the contact openings 322, a contact (CT) structure 323 is formed in the contact openings 322 (see FIG. 14) and is electrically connected to the floating node structure 319' and the gate structure 317. In some embodiments, the contact structure 323 includes two contacts 323' that are respectively formed in the contact openings 322 and are respectively connected to the floating node structure 319' and the gate structure 317. The formation of the contact openings 322 and the contact structure 323 may be collectively referred to as a step of forming a contact structure, as illustrated as process 224 in the flow chart 200 shown in FIG. 4. The contact structure 323 may be formed by a suitable technique, such as CVD or the like, and may be made of a suitable conductive material, such as tungsten (W), ruthenium (Ru), cobalt (Co), tantalum (Ta), Titanium (Ti), copper (Cu) or the like. In some embodiments, a suitable planarization process (e.g., CMP or the like) may be adopted to remove an excess amount of conductive material on a top surface 343 of the first dielectric layer 321. In some embodiments, prior to the formation of the contact structure 323, the opening wall 332 defining each of the contact openings 322 (see FIG. 14) may be formed with a barrier layer 324. In some embodiments, the barrier layer 324 may be made of a suitable material, such as TaN, TiN, Ru, MnN, ZnO, MoN, Ta, Ti, Co, Ru, combinations thereof, or the like.

Figure 16:
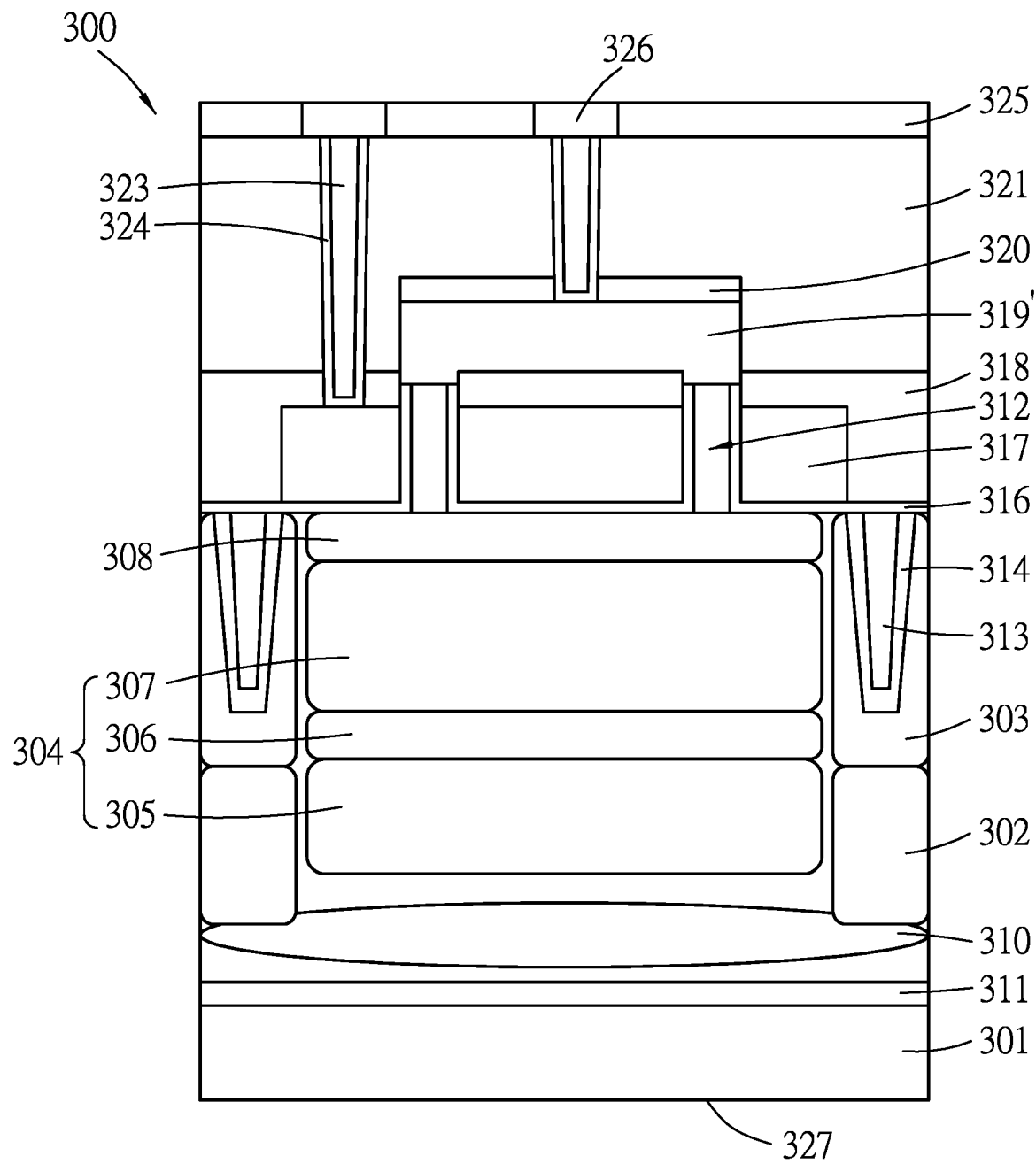

Referring to FIG. 16, after the formation of the contact structure 323, a second dielectric layer 325 may be formed on the first dielectric layer 321, followed by forming a metal layer 326 in the second dielectric layer 325 such that the metal layer 326 is electrically connected to the contact structure 323, thereby obtaining the photosensor 300. Such processes are collectively referred to as a step of forming a metal layer, as illustrated as process 226 in the flow chart 200 shown in FIG. 4. The metal layer 326 may be formed by employing a semiconductor back-end process, such as a damascene process, and may be made of a suitable material, such as Cu, Co, W, Ru, Mo, Al or the like. In accordance with some embodiments, multiple layers of dielectrics and metal layers may be formed over the first dielectric layer 321 to form an interconnect structure. In some embodiments, a redistribution layer (RDL) (not shown) may be formed over the metal layer 326.

Figure 17:
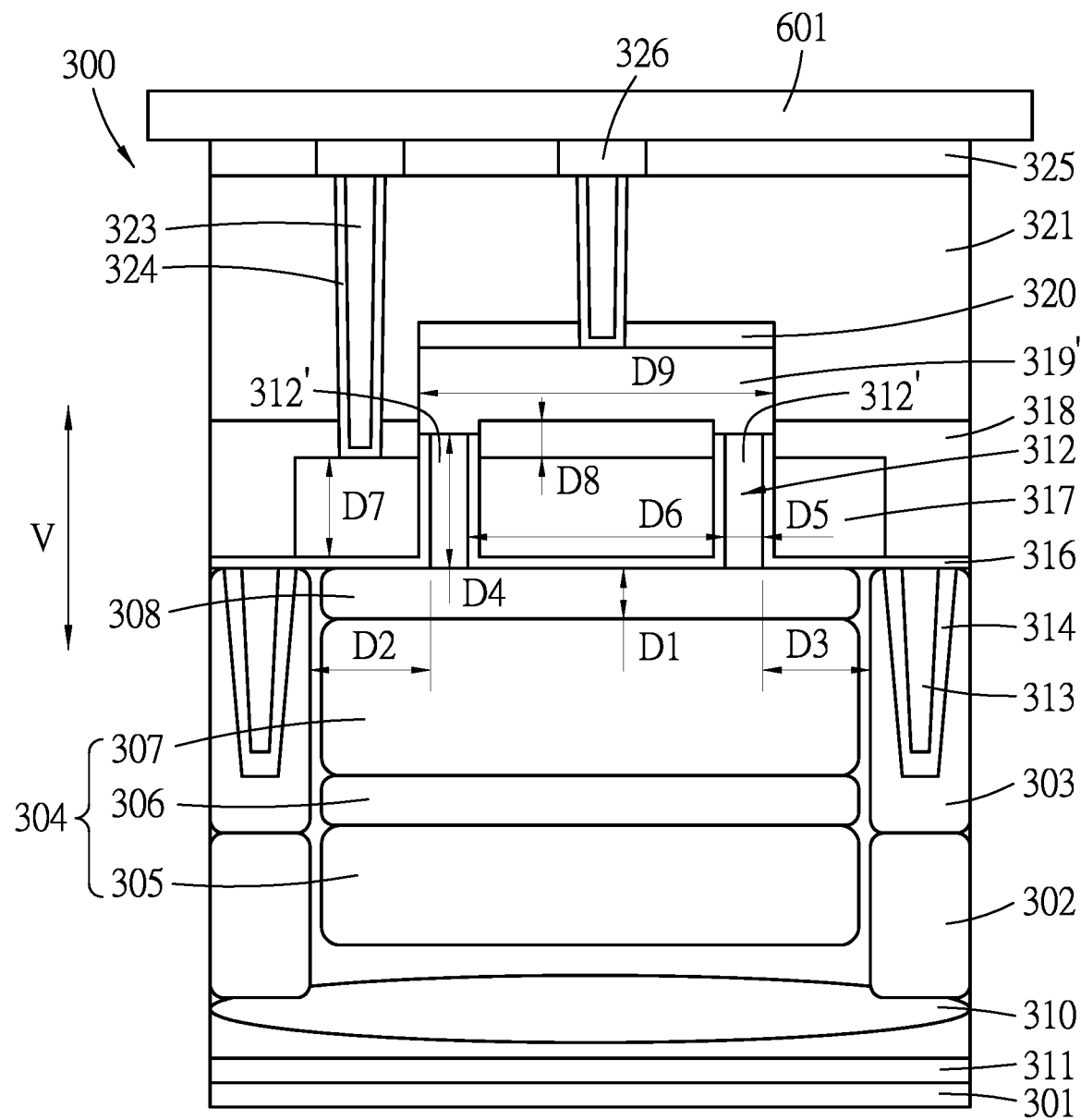

Referring to FIG. 17, after obtaining the photosensor 300, the metal layer 326 may be electrically connected to a suitable circuit board 601 (e.g., an application specific integrated circuit (ASIC) or the like), followed by thinning the substrate 301 from a backside 327 (see FIG. 16) to a desirable thickness.

Figure 18:
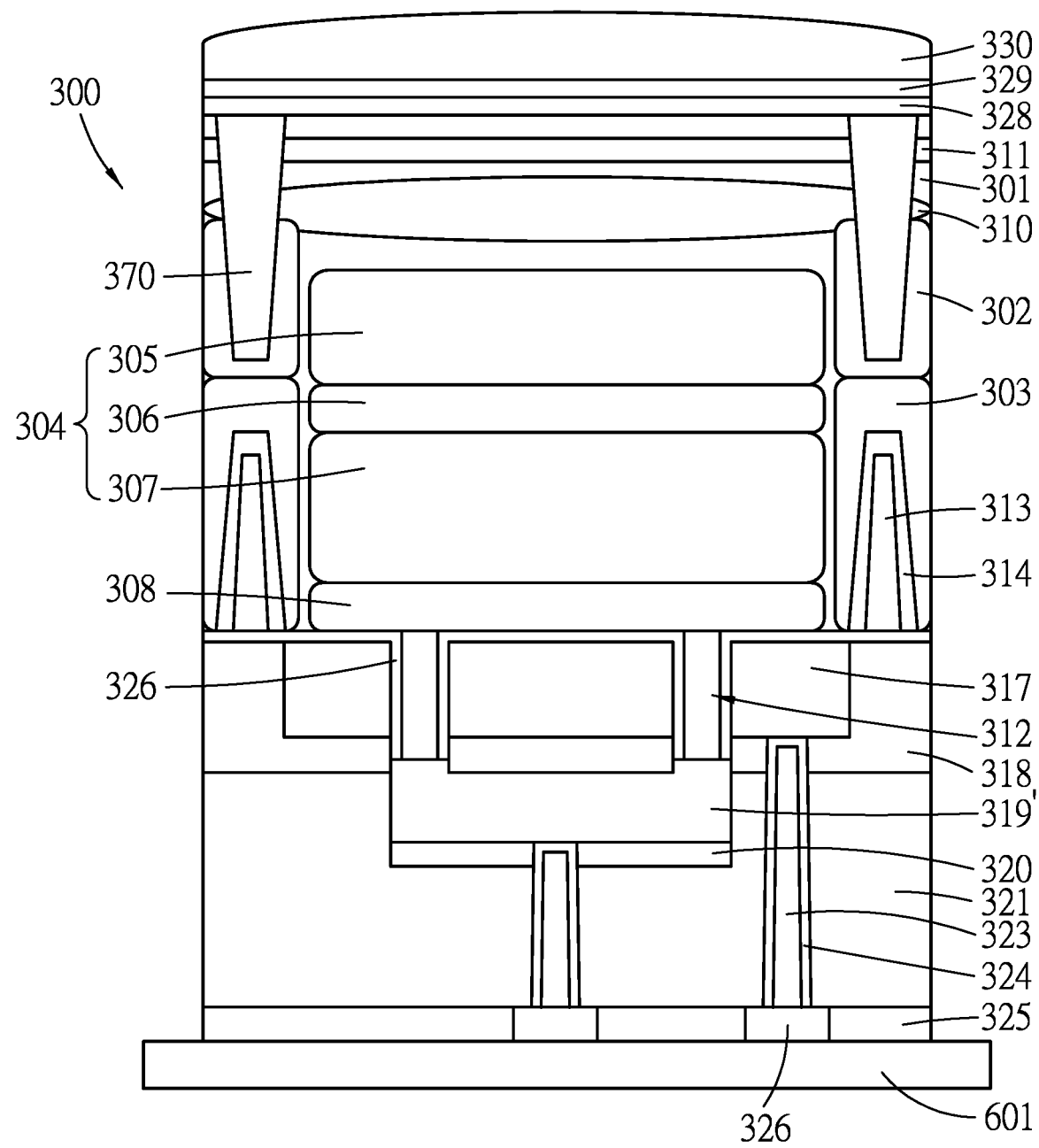

Referring to FIG. 18, after the substrate 301 is thinned, a trench isolation layer 370 may be formed in the photosensor 300 for providing better isolation to the n-type doped region 304 of the photosensor 300. In some embodiments, a trench hole (not shown) may be formed in the backside 327 (see FIG. 16), and may penetrate the backside doping region 311 and the deep doped region 310, and reaches the deep p-well 302, followed by filling the trench hole with a suitable material, such as silicon oxide, silicon nitride, silicon carbide or the like. Afterwards, in some embodiments, a backside illumination anti-reflective coating (BSI ARC) 328, a color filter (CF) film 329 and a microlens (ML) 330 may be sequentially formed on the backside 327 of the substrate 301.

Referring back to FIG. 17, in some embodiments, a distance (D1) between the gate dielectric layer 316 and the n-type doped region 304 may range from about 1 nm to about 100 nm, and other range values are also within the scope of the disclosure. In some embodiments, a minimum distance (D2, D3) between one of the channel regions 312' and the cell p-well 303 may range from about 10 nm to about 500 nm, and other range values are also within the scope of the disclosure. In some embodiments, D2 may be equal to D3, and in other embodiments, D2 may differ from D3. In some embodiments, a height (D4) of each of the channel regions 312' of the channel structure 312 may range from about 10 nm to about 300 nm, and other range values are also within the scope of the disclosure. In some embodiments, a width (D5) of each of the channel regions 312' of the channel structure 312 may range from about 1 nm to about 500 nm, and other range values are also within the scope of the disclosure. In some embodiments, the channel region 312' having the width (D5) less than 1 nm may be difficult to make, while the channel region 312' having the width (D5) greater than 500 nm may not be effectively controlled by the gate structure 317. In some embodiments, a distance (D6) between two adjacent channel regions 312' of the channel structure 312 may range from about 10 nm to about 1 μm, and other range values are also within the scope of the disclosure. In some embodiments, a height (D7) of the gate structure 317 may range from about 10 nm to about 300 nm, and other range values are also within the scope of the disclosure. In some embodiments, a distance (D8) between the gate structure 317 and the floating node structure 319' may range from about 1 nm to about 50 nm, and other range values are also within the scope of the disclosure. In some embodiments, a width (D9) of the floating node structure 319' may range from about 50 nm to about 1 µm, and other range values are also within the scope of the disclosure.

Figure 23:
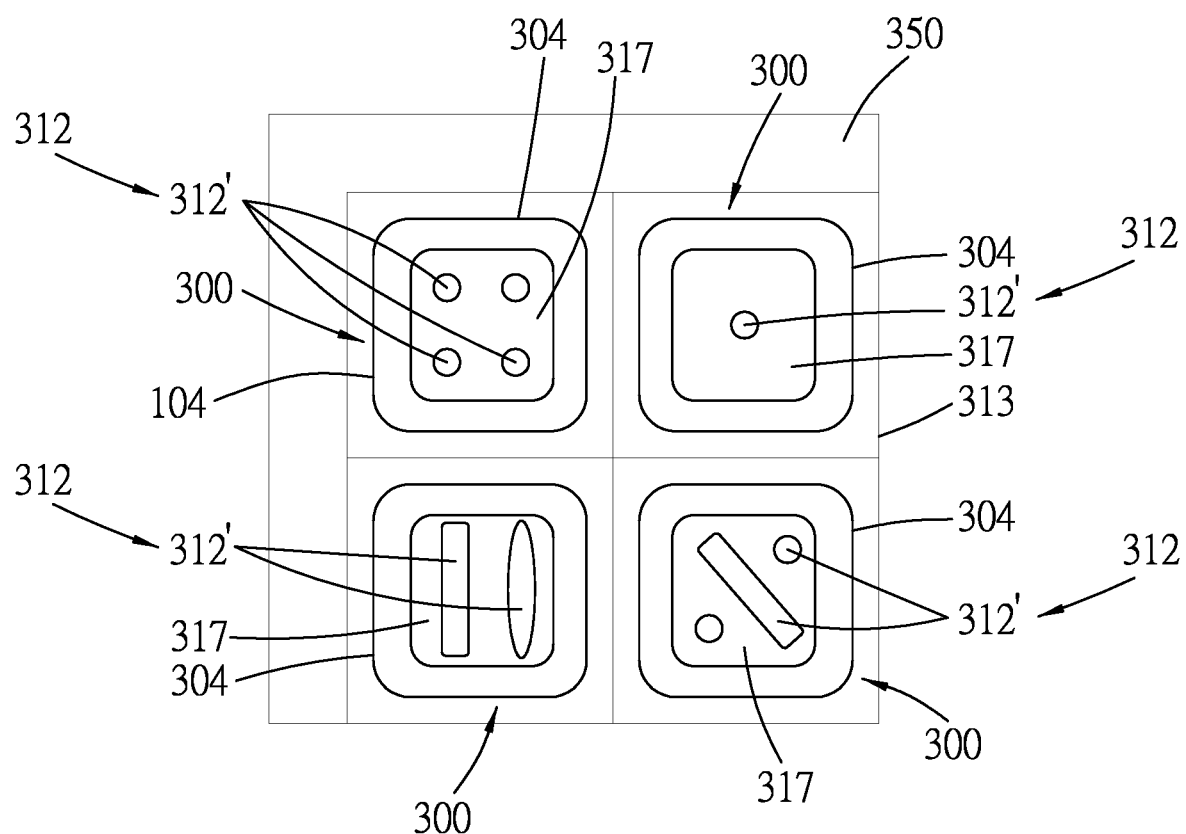
FIG. 23 is a schematic top view showing an arrangement of multiple photosensors in accordance with some embodiments.

FIG. 23 is a schematic top view showing four photosensors 300, each having a distinct channel structure 312. The channel structure 312 of the upper left photosensor 300 includes four of the channel regions 312', each having a circular cross section. The channel structure 312 of the upper right photosensor 300 includes only one channel region 312' which has a circular cross section. The channel structure 312 of the lower left photosensor 300 includes two of the channel regions 312' which respectively have a substantially rectangular cross section and an elliptical cross section. The channel structure 312 of the lower right photosensor 300 includes three of the channel regions 312', two of which have circular cross sections, and one of which has a substantially rectangular cross section. It should be noted that the number, shape, and arrangement of the channel region 312' of the channel structure 312 should not be limited to what are disclosed here, and may be changed according to practical requirements. In FIG. 23, each n-type doped region 304 is shown to work with one gate structure 317. However, in other embodiments, there can be multiple n-type doped regions 304 sharing one gate structure 317. Multiple pixel devices (not shown), including source follower transistors, reset devices (reset transistors), row select devices (row select transistors) or the like, may be arranged in a region 350 adjacent to the photosensors 300.

Figure 24:
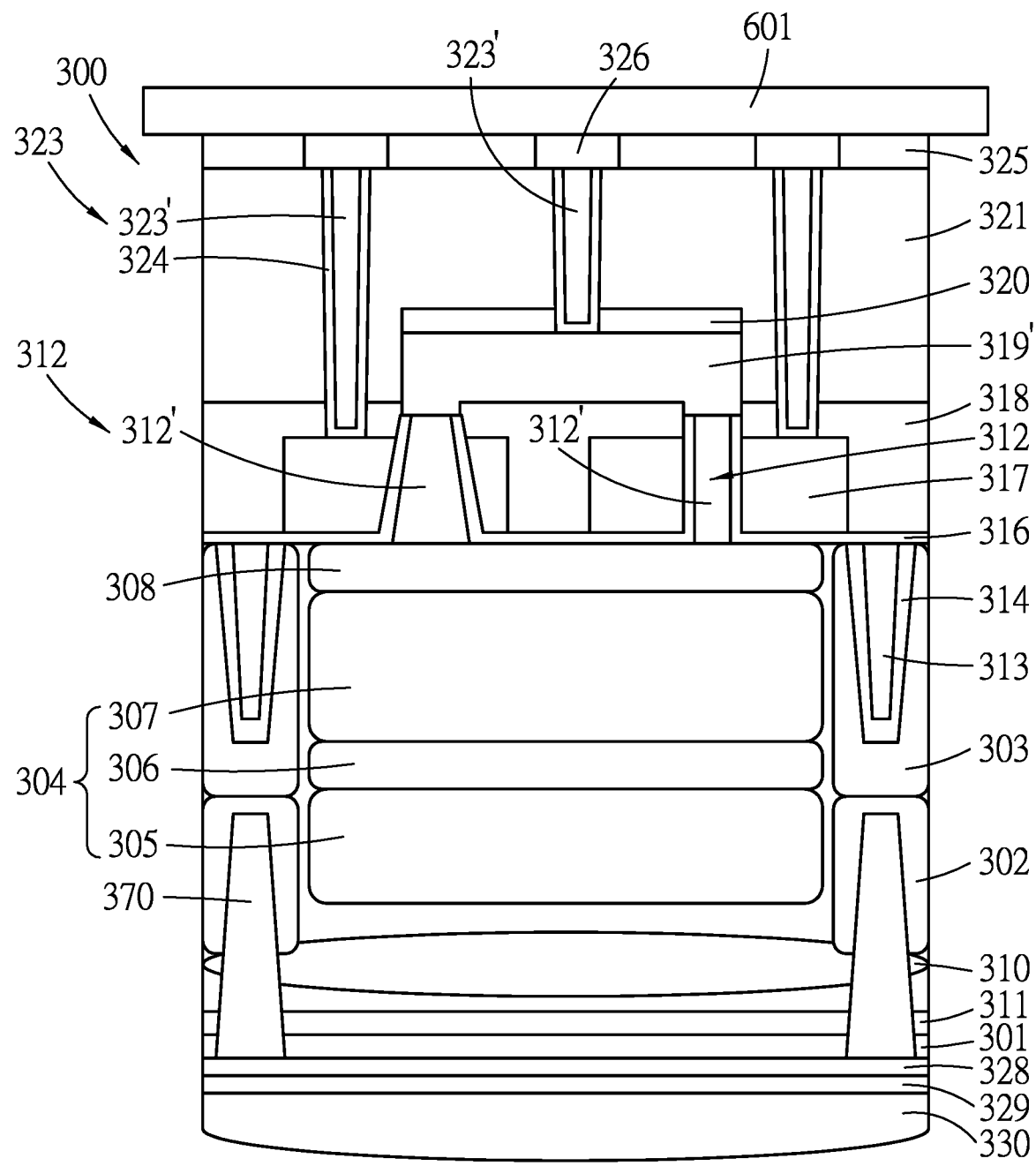
FIGS. 24 and 25 are schematic views of photosensors in accordance with some embodiments.

Referring to FIG. 24, in accordance with some embodiments, the photosensor 300 may include a plurality of gate structures 317 that respectively surround the channel regions 312' of the channel structure 312. In some embodiments, one of the channel regions 312' has a rectangular cross section (i.e., is a cylinder), another one of the channel regions 312' has a trapezoidal cross section (i.e., is a frustum), and other geometries are also within the scope of the disclosure.

Figure 25:
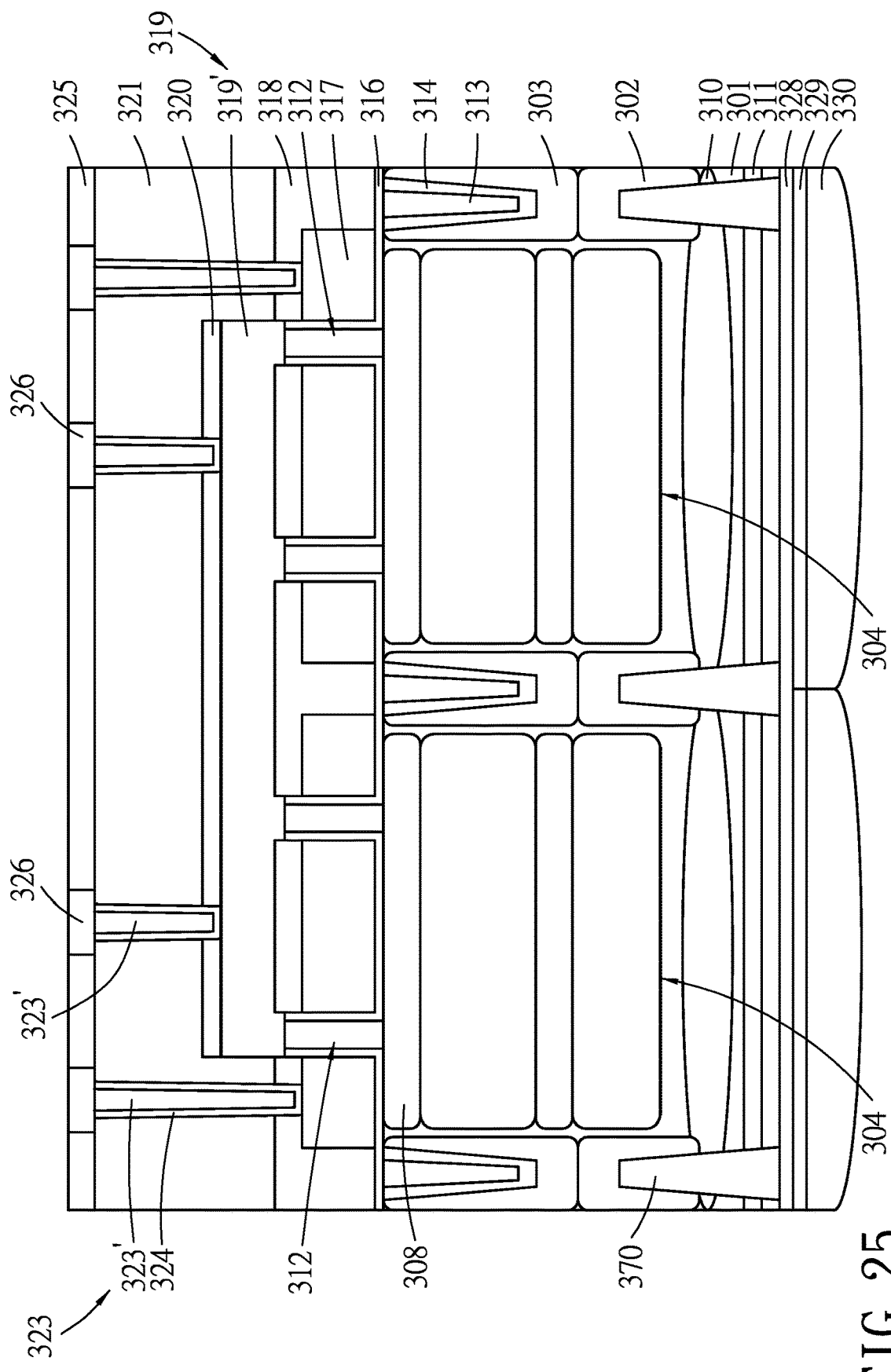

FIG. 25 shows that, in accordance with some embodiments, two n-type doped regions 304 are respectively connected to two channel structures 312, which are respectively controlled by two gate structures 317. The channel structures 312 are both connected to a floating node unit 319 which includes one floating node structure 319'. In this embodiments, two contacts 323' are shown to be connected to the floating node structure 319'. The number of the contact(s) 323' connected to the floating node structure 319' can be changed according to practical requirements. In other embodiments, the floating node unit 319 may include multiple floating node structures 319' (only one is shown in FIG. 25), and each of the floating node structures 319' is connected to a respective one of the channel structures 312.

Figure 26:
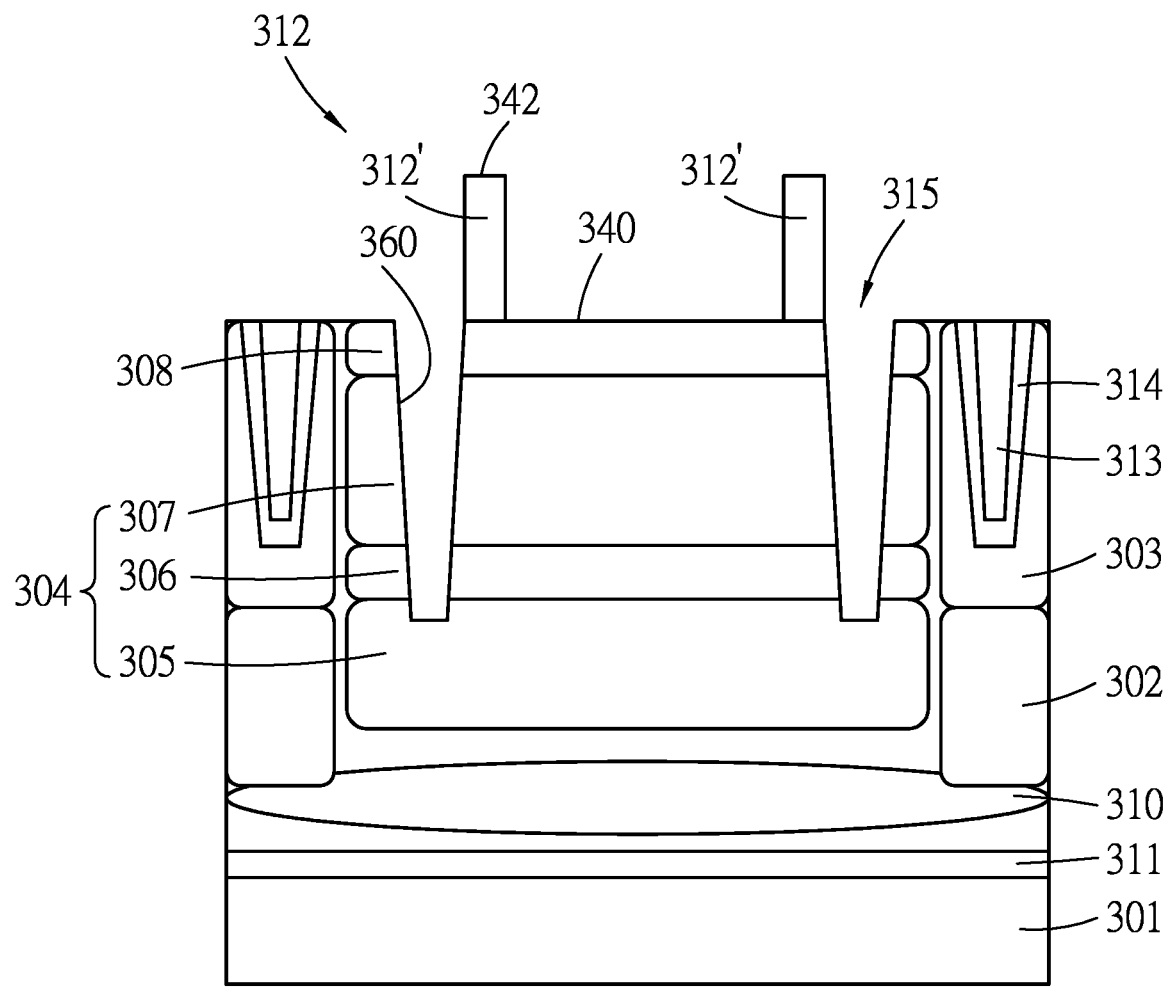
FIG. 26 through FIG. 28 illustrate schematic views of stages in the formation of a photosensor in accordance with some embodiments.

Referring to FIG. 26, in accordance with some embodiments, after the formation of the isolation structure 313 (i.e., process 208 in the flow chart 200 shown in FIG. 4), an opening 315 is formed by a suitable technique (e.g., dry etch or the like) to penetrate the p-type doped region 308 and the second and third sub-regions 306, 307 of the n-type doped region 304 and to extend into the first sub-region 305 of the n-type doped region 304. In certain embodiments, the opening 315 may stop at the second sub-region 306 or at the third sub-region 307, and may be defined by an inner wall 360. In some embodiments, the opening 315 may have a circular top view (i.e., may be circular when viewing from the top), and other geometries are also within the scope of the disclosure.

Figure 27:
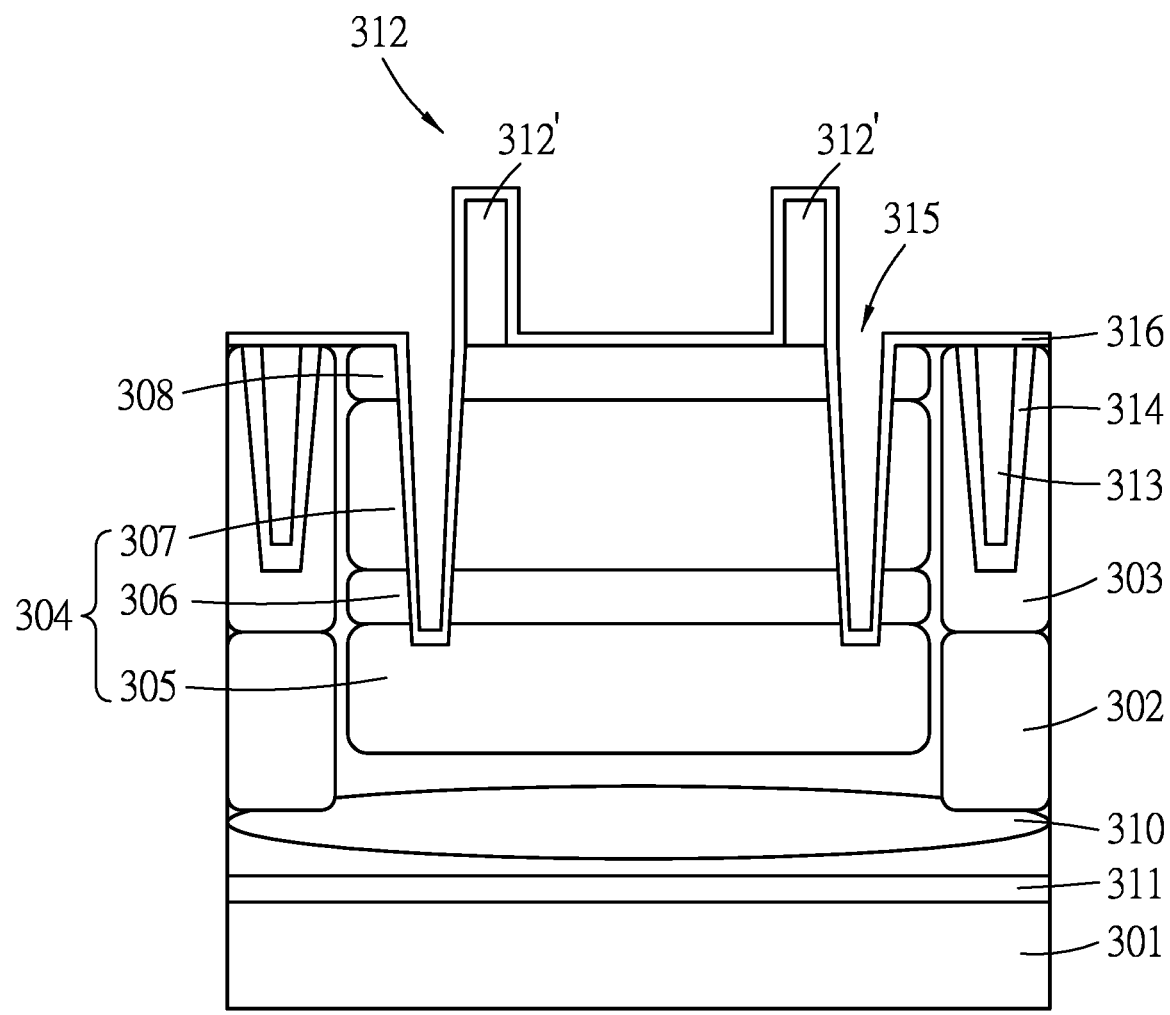

Referring to FIG. 27, after the formation of the opening 315, the gate dielectric layer 316 is conformally formed to cover the inner wall 360 (see FIG. 26) and the top surface 340 of the substrate 301 (see FIG. 26), and to encapsulate the channel structure 312. The gate dielectric layer 316 is made by a suitable technique, such as CVD, PVD, ALD, or the like. The gate dielectric layer 316 may be made of a suitable material, such as silicon oxide, a high-k dielectric material (e.g., hafnium oxide, hafnium silicon oxide, hafnium tantalum oxide, aluminum oxide, zirconium oxide, etc.), or the like. In some embodiments, the gate dielectric layer 316 may have a thickness ranging from about 1 nm to about 10 nm. In other embodiments, the gate dielectric layer 316 may have a thickness ranging from about 2 nm to about 6 nm, and other range values are also within the scope of the disclosure. In some embodiments, the gate dielectric layer 316 in the opening 315 may be thinner than other portion of the gate dielectric layer 316 (e.g., the gate dielectric layer 316 on the top surface 340 of the substrate 301 (see FIG. 26) and the gate dielectric layer 316 encapsulating the channel structure 312).

Figure 28:
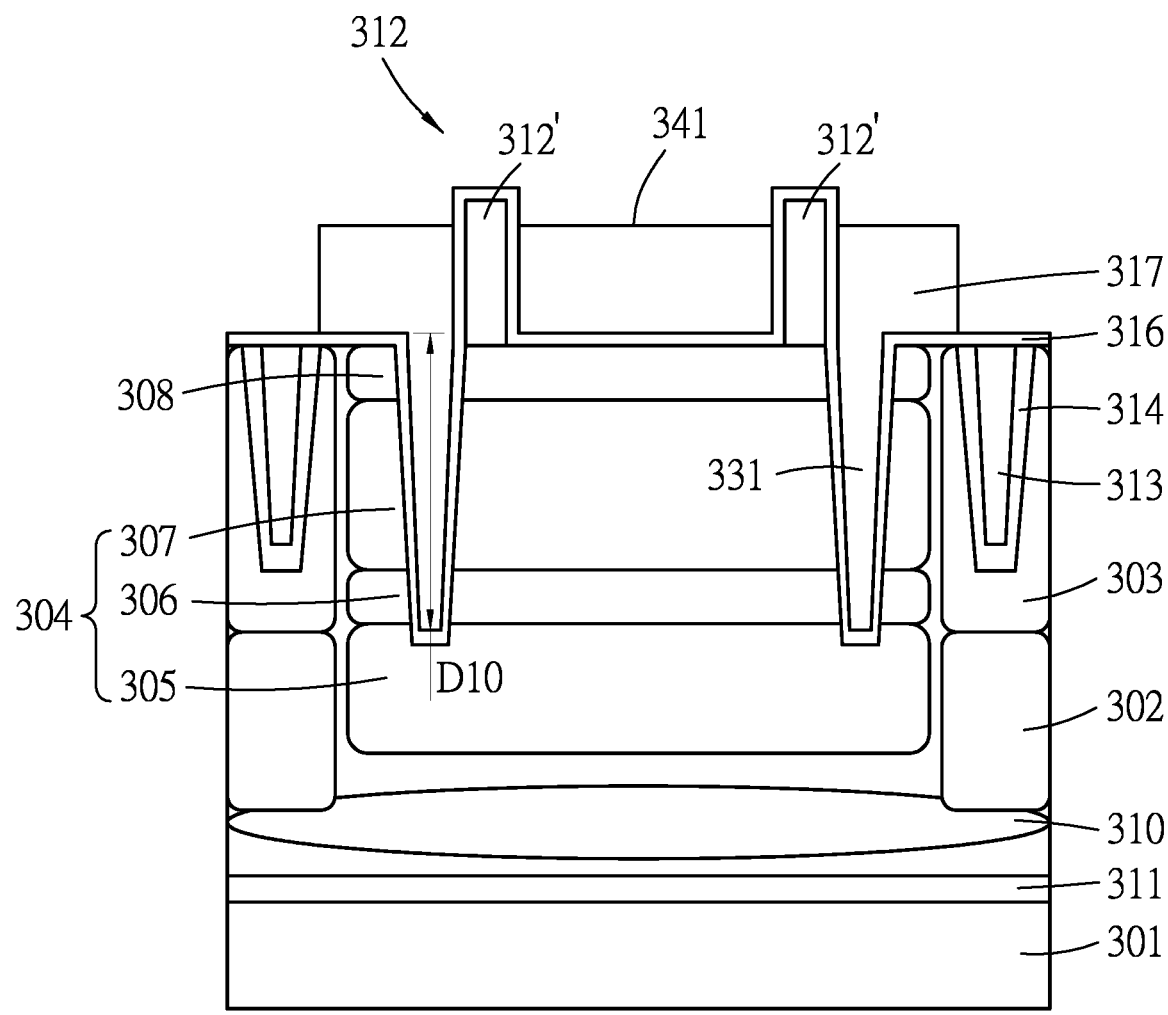

Referring to FIG. 28, after the formation of the gate dielectric layer 316, the gate structure 317 is formed over the substrate 301 by a suitable technique, such as CVD, PVD, ALD, or the like. The gate structure 317 may be made of a suitable material, such as polysilicon, metal or a metal compound (e.g., TiN, TaN, W, Ti, Ta, Al or the like), or the like. In some embodiments, the opening 315 (see FIG. 27) is filled with the gate structure 317, the gate structure 317 surrounds a portion of the channel structure 312 and a portion of the gate dielectric layer 316 formed on the channel structure 312, and the top surface 341 of the gate structure 317 is lower than the top surface 342 of the channel structure 312 (see FIG. 26). The gate structure 317 filled in the opening 315 may be referred to as a vertical transfer gate (VTG) 331, which may have a height (D10) ranging from about 100 nm to about 800 nm, and other range values are also within the scope of the disclosure. In some embodiments, the vertical transfer gate 331 may be adjacent to one of the channel regions 312' of the channel structure 312. In other embodiments, the vertical transfer gate 331 may be spaced apart from the channel region 312' by a distance not greater than about 200 nm, and other range values are also within the scope of the disclosure. The number of the vertical transfer gate(s) 331 may be the same as or different from the number of the channel region(s) 312' of the channel structure 312. After the formation of the gate structure 317, processes 214 to 226 in the flow chart 200 shown in FIG. 4 may be conducted.

Figure 29:
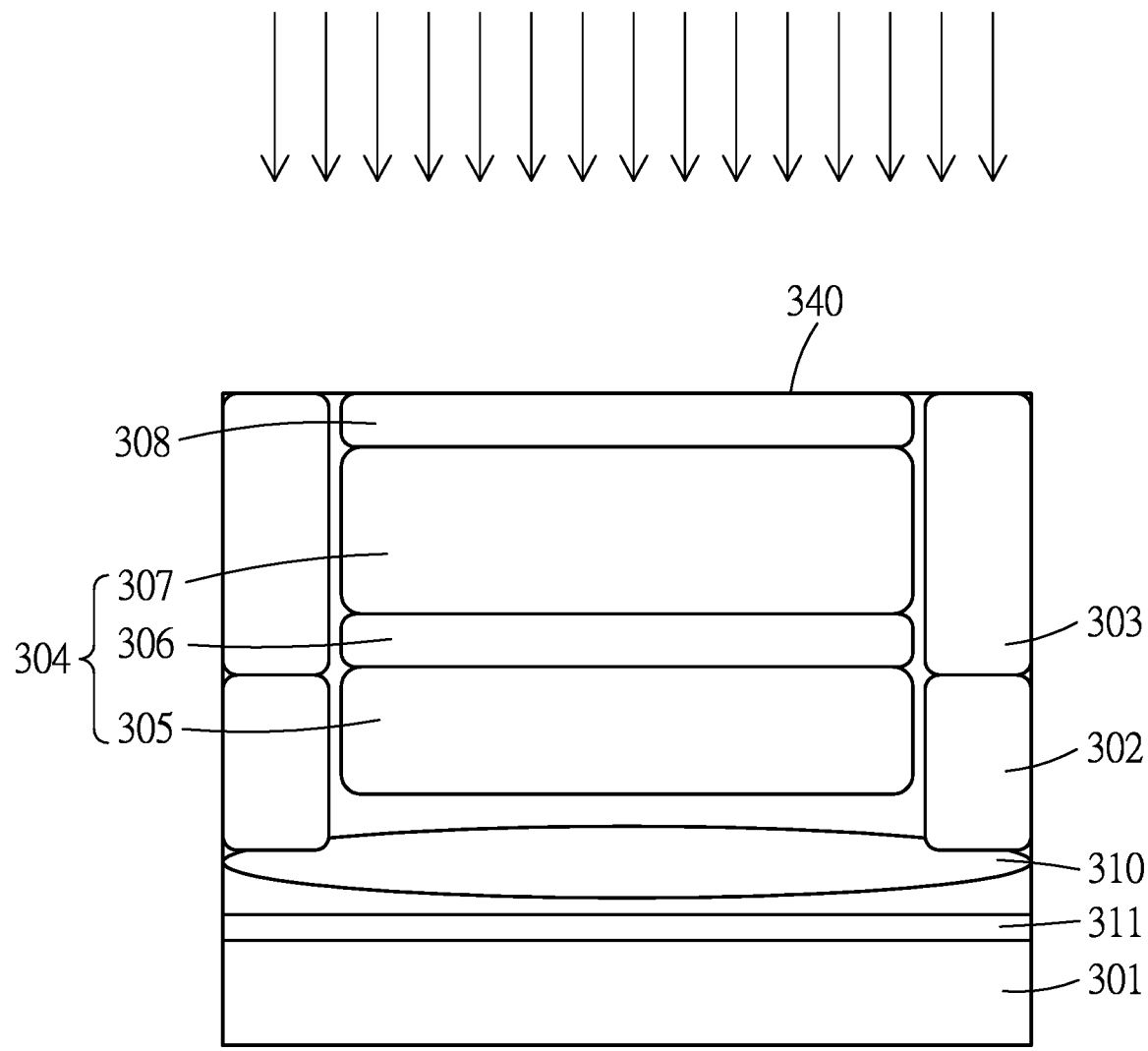
FIG. 29 through FIG. 32 illustrate schematic views of stages in the formation of a photosensor in accordance with some embodiments.

Referring to FIG. 29, in the process of doping the substrate 301, the channel doped region 309 (see FIG. 6) may not be formed, and the p-type doped region 308 and the cell p-well 303 are formed in such a manner that top surfaces of the p-type doped region 308 and the cell p-well 303 are flush with the top surface 340 of the substrate 301. In other embodiments, the channel doped region 309 may not be formed, and the p-type doped region 308 is formed in such a manner that the p-type doped region 308 is spaced apart from and adjacent to the top surface 340 of the substrate 301.

Figure 30:
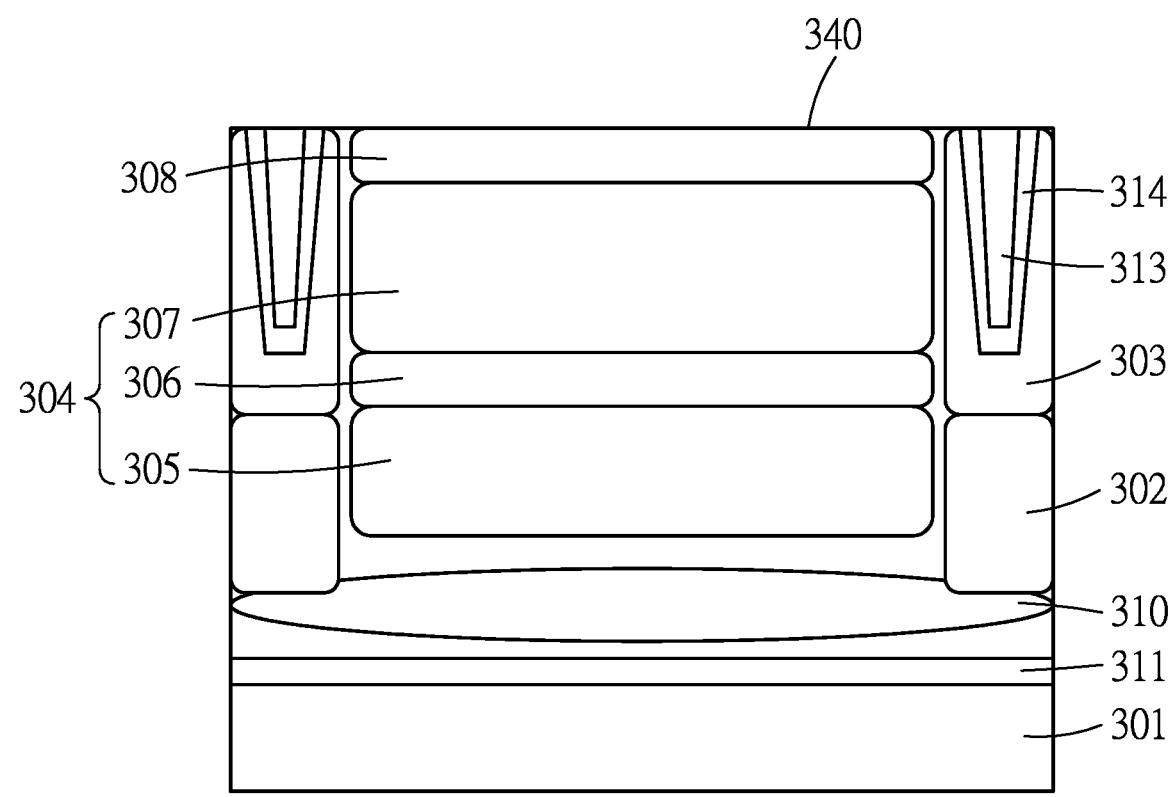

Referring to FIG. 30, after the doping process, the isolation structure 313 and the filed light doping region 314 may be formed in the cell p-well 303.

Figure 31:
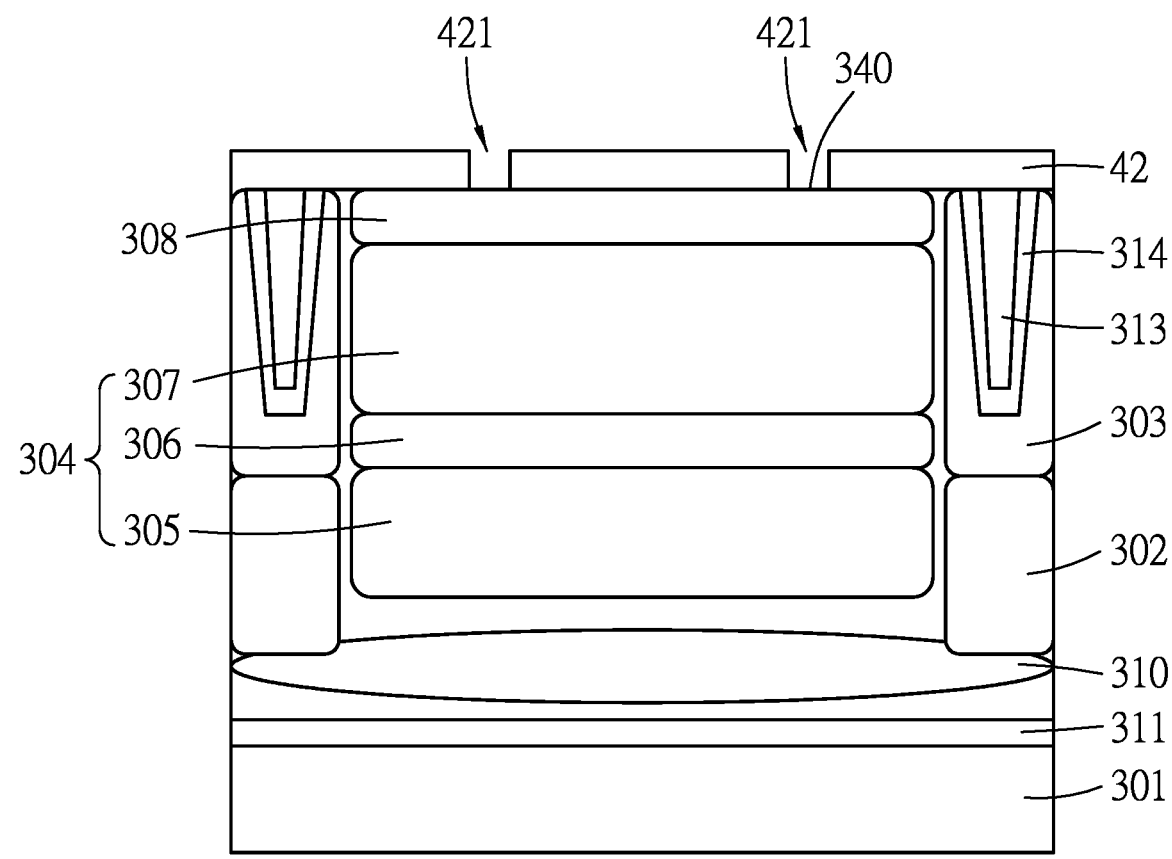

Referring to FIG. 31, after the formation of the isolation structure 313 and the filed light doping region 314, a mask layer 42 may be formed on the top surface 340 of the substrate 301. In some embodiments, the mask layer 42 may be a hardmask made of a suitable material, such as metal oxide, metal nitride, or the like, and may be formed by a suitable technique, such as PVD, CVD, ALD, or the like. Afterwards, the mask layer 42 may be etched by a suitable technique, such as dry etch or the like, to form one or more openings 421 that expose the top surface 340 of the substrate 301.

Figure 32:
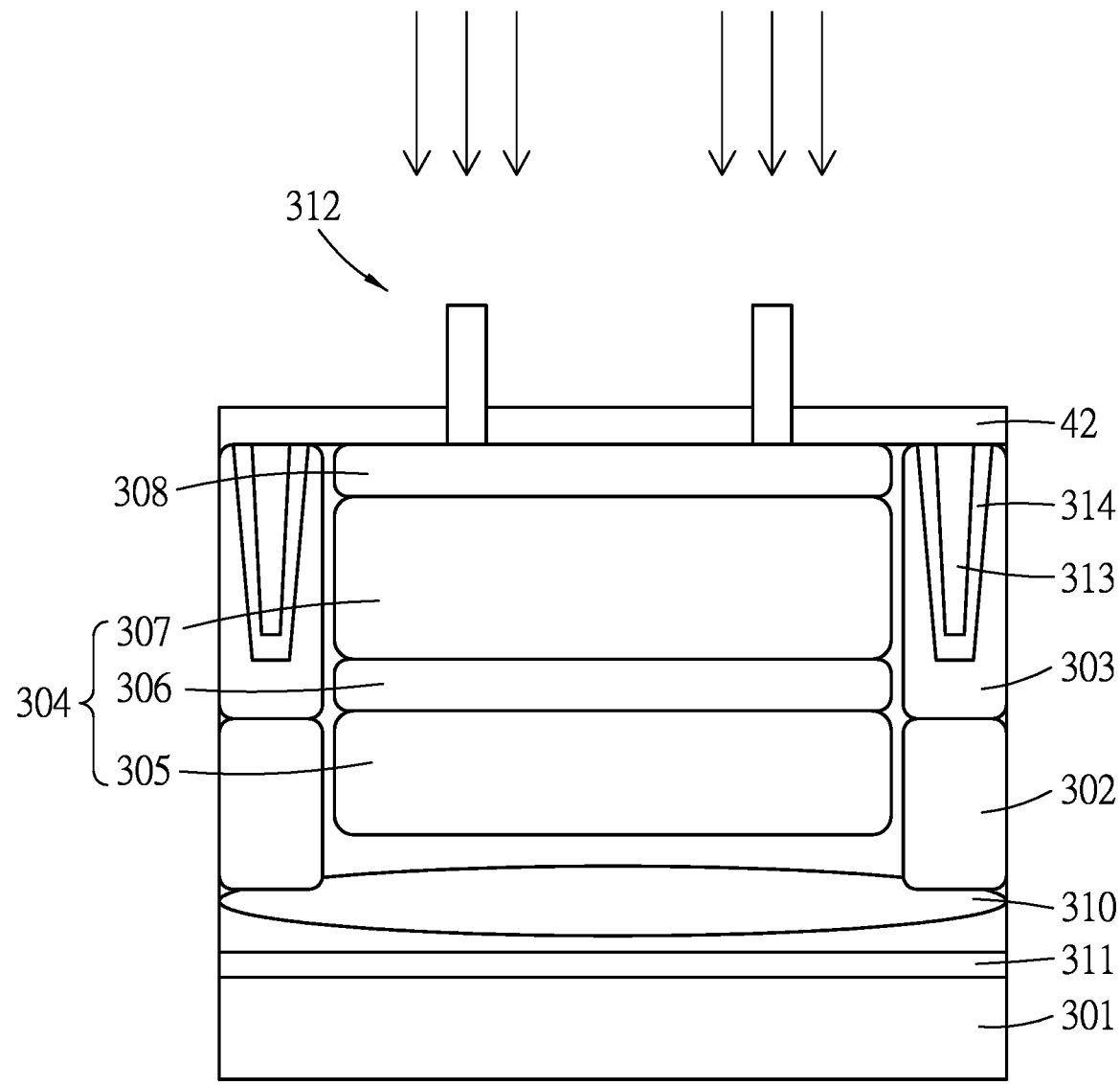

Referring to FIG. 32, after the formation and etching of the mask layer 42, the channel structure 312 is grown from the top surface 340 of the substrate 301 (see FIG. 31) by a suitable bottom-up growth technique, such as epitaxial growth or the like. In some embodiments, the mask layer 42 has a thickness ranging from about 1 nm to about 50 nm, and other range values are also within the scope of the disclosure. In some embodiments, after the formation of the channel structure 312, the channel structure 312 may be doped with a suitable dopant (e.g., boron or the like), and the doping concentration of the channel structure 312 may range from about $10^{15}/cm^3$ to about $10^{18}/cm^3$, and other concentration values are also within the scope of the disclosure. Afterwards, the mask layer 42 may be removed by a suitable technique, such as HF wet etching or the like. After the removal of the mask layer 42, processes 210 to 226 in the flow chart 200 shown in FIG. 4 may be conducted.

The embodiments of the present disclosure have some advantageous features. By having the n-type doped region 304, the channel structure 312/the gate structure 317, and the floating node structure 319' stacked vertically (e.g., along the vertical direction (V) as shown in FIG. 17), the photosensor 300 has a reduced pixel size (i.e., occupies a less area). In addition, with the gate structure 317 surrounding the channel structure 312, the photosensor 300 can have improved switch control. Moreover, the vertical transfer gate 331 improves the pull-out efficiency of the electron from the n-type doped region 304 to the floating node structure 319', which, for example, may improve the image quality (i.e., reduce image lag) of the photosensor 300 when being used as an image sensor.

In accordance with some embodiments, a photosensor includes a substrate, a photo-detecting column, a gate structure, a floating node structure and a channel structure. The substrate has a first doping type. The photo-detecting column has a second doping type and is disposed in the substrate. The gate structure is disposed on the substrate in a vertical direction, and is electrically insulated from the photo-detecting column. The floating node structure is disposed on the gate structure opposite to the photo-detecting column in the vertical direction, and is electrically insulated from the gate structure. The channel structure extends through the gate structure, is electrically insulated from the gate structure, and is electrically connected to the photo-detecting column and the floating node structure.

In accordance with some embodiments, a photosensor includes a substrate, a plurality of photo-detecting columns, an isolation structure, a gate dielectric layer, a plurality of gate structures, a plurality of channel structures and a floating node unit. The substrate has a first doping type. The photo-detecting columns have a second doping type, and are disposed in the substrate. The isolation structure is disposed in the substrate, and separates the photo-detecting columns from one another. The gate dielectric layer is disposed on the substrate. The gate structures are disposed on the substrate. Each of the gate structures is aligned with a respective one of the photo-detecting columns and is separated from the respective one of the photo-detecting columns by the gate dielectric layer. Each of the channel structures is electrically connected to a respective one of the photo-detecting columns, penetrates a respective one of the gate structures, and is separated from the respective one of the gate structure by the gate dielectric layer. The floating node unit is disposed on the gate structure opposite to the photo-detecting columns, is electrically connected to the channel structures, and is separated from the gate structures.

In accordance with some embodiments, a method of forming a photosensor includes: forming an isolation structure in a substrate, the substrate having a first doping type; forming a photo-detecting column in the substrate, the photo-detecting column having a second doping type; forming a channel structure on the substrate, the channel structure being electrically connected to the photo-detecting column; forming a gate dielectric layer on the substrate, the gate dielectric layer encapsulating the channel structure; forming a gate structure that surrounds the channel structure and that is separated from the channel structure by the gate dielectric layer; forming a supporting structure that encapsulates the gate dielectric layer and the gate structure; removing a portion of the supporting structure and a portion of the gate dielectric layer to expose a top surface of the channel structure; and forming a floating node structure on the supporting structure, the floating node structure being connected to the top surface of the channel structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A photosensor comprising:
   a substrate having a first doping type;
   a photo-detecting column having a second doping type and disposed in the substrate;
   a gate structure disposed on the substrate in a vertical direction, and electrically insulated from the photo-detecting column;
   a floating node structure disposed on the gate structure, and electrically insulated from the gate structure; and
   a channel structure having two channel regions, each of which extends through the gate structure, each of the two channel regions being electrically insulated from the gate structure, and being connected to the photo-detecting column and the floating node structure,
   wherein the gate structure has a portion located between the two channel regions,
   wherein the floating node structure is directly above the portion of the gate structure in the vertical direction, and has a bottom surface that confronts the channel structure and that is at a level not lower than a level of a top surface of the gate structure,
   wherein the floating node structure includes polysilicon, a metal or a metal compound, and
   wherein the photosensor further comprises a supporting structure which has a dielectric portion disposed between and connected to the floating node structure and the gate structure, a bottom surface of the dielectric portion being in direct contact with the gate structure and being at a level lower than a level of a bottom surface of the floating node structure.

2. The photosensor as claimed in claim 1, wherein each of the two channel regions of the channel structure is partially surrounded by the gate structure.

3. The photosensor as claimed in claim 1, further comprising a gate dielectric layer which is disposed between the substrate and the gate structure, and which is in contact with and surrounds each of the two channel regions of the channel structure such that the gate structure is separated from the photo-detecting column and the channel structure by the gate dielectric layer.

4. The photosensor as claimed in claim 1, wherein the channel structure has the first doping type.

5. The photosensor as claimed in claim 1, wherein each of the two channel regions of the channel structure is tapered toward the floating node structure or the photo-detecting column.

6. The photosensor as claimed in claim 1, wherein each of the two channel regions of the channel structure has a horizontal cross section of circle, oval, or rectangle.

7. The photosensor as claimed in claim 1, wherein each of the two channel regions of the channel structure has a height ranging from 10 nm to 300 nm, and a width ranging from 1 nm to 500 nm.

8. The photosensor as claimed in claim 1, further comprising a supporting structure disposed on the substrate, the gate structure being disposed in the supporting structure, the floating node structure being disposed on the supporting structure and being separated from the gate structure by the supporting structure.

9. The photosensor as claimed in claim 1, further comprising an isolation structure that is disposed in the substrate and that surrounds the photo-detecting column.

10. The photosensor as claimed in claim 1, further comprising a doped region that is formed in the substrate, that is disposed between the photo-detecting column and the gate structure, and that has the first doping type.

11. The photosensor as claimed in claim 1, wherein the gate structure has a vertical transfer gate that extends into the photo-detecting column and that is electrically insulated from the photo-detecting column.

12. The photosensor as claimed in claim 11, wherein a minimum distance between the channel structure and the vertical transfer gate ranges from 0 to 200 nm.

13. A photosensor comprising:
a substrate having a first doping type;
a plurality of photo-detecting columns having a second doping type, the photo-detecting columns being disposed in the substrate;
an isolation structure disposed in the substrate, the isolation structure separating the photo-detecting columns from one another;
a gate dielectric layer disposed on the substrate in a vertical direction;
gate structures disposed on the substrate, each of the gate structures being aligned with a respective one of the photo-detecting columns and being separated from the respective one of the photo-detecting columns by the gate dielectric layer; and
channel structures, each of the channel structures having two channel regions, the two channel regions of each of the channel structures being connected to a respective one of the photo-detecting columns, penetrating a respective one of the gate structures, and being separated from the respective one of the gate structures by the gate dielectric layer; and
a floating node unit disposed on the gate structures opposite to the photo-detecting columns, connected to the channel structures, and being separated from the gate structures,
wherein each of the gate structures has a portion located between the two channel regions of a respective one of the channel structures,
wherein the floating node unit is directly above the portion of each of the gate structures in the vertical direction, and has a bottom surface that confronts the channel structures and that is at a level not lower than a level of top surfaces of the gate structures,
wherein the floating node unit includes polysilicon, a metal or a metal compound, and
wherein the photosensor further comprises a supporting structure which has a T-shaped feature disposed among the floating node unit and two adjacent ones of the gate structures, the T-shape feature including
a horizontal portion having a top surface connected to the floating node unit, and a bottom surface connected to a top surface of each of the two adjacent ones of the gate structures, and
a vertical portion extending from the bottom surface of the horizontal portion and disposed between the two adjacent ones of the gate structures.

14. The photosensor as claimed in claim 13, wherein the two channel regions in each of the channel structures are in contact with and are surrounded by the gate dielectric layer, and the two channel regions in each of the channel structures are partially surrounded by the respective one of the gate structures.

15. The photosensor as claimed in claim 13, wherein at least one of the two channel regions in each of the channel structures is tapered toward the floating node unit or the respective one of the photo-detecting columns.

16. The photosensor as claimed in claim 13, wherein at least one of the gate structures has a vertical transfer gate that extends into the respective one of the photo-detecting columns, the vertical transfer gate being surrounded by the gate dielectric layer and being separated from the respective one of the photo-detecting columns by the gate dielectric layer.

17. The photosensor as claimed in claim 13, wherein the floating node unit includes a plurality of floating node structures, each of which is connected to the two channel regions of a respective one of the channel structures.

18. A photosensor comprising:
a substrate having a first doping type;
a photo-detecting column having a second doping type and disposed in the substrate;
a floating node structure disposed on the photo-detecting column;
a channel structure connected to and disposed between the photo-detecting column and the floating node structure; and
a gate structure disposed on the substrate and surrounding the channel structure, the gate structure being separated from the channel structure, the floating node structure and the photo-detecting column,
wherein the channel structure has two channel regions, each of which is surrounded by the gate structure, and the gate structure has a portion located between the two channel regions,
wherein the floating node structure is directly above the portion of the gate structure in a vertical direction, and has a bottom surface that confronts the channel structure and that is at a level not lower than a level of a top surface of the gate structure,
wherein the floating node structure includes polysilicon, a metal or a metal compound,
wherein the photosensor further comprises a supporting structure which has a dielectric portion disposed between and connected to the floating node structure and the gate structure, a bottom surface of the dielectric portion being in direct contact with the gate structure and being at a level higher than a level of a top surface of the gate structure.

19. The photosensor as claimed in claim 18, further comprising a supporting structure disposed on the substrate, the gate structure being disposed in the supporting structure, the floating node structure being disposed on the supporting structure and being separated from the gate structure by the supporting structure.

20. The photosensor as claimed in claim 18, further comprising a gate dielectric layer which is disposed between the substrate and the gate structure, and which is in contact with and surrounds the two channel regions of the channel structure, such that the gate structure is separated from the photo-detecting column and the channel structure by the gate dielectric layer.

* * * * *